US011121354B2

(12) United States Patent
Wang et al.

(10) Patent No.: US 11,121,354 B2
(45) **Date of Patent: *Sep. 14, 2021**

(54) SYSTEM WITH POWER JET MODULES AND METHOD THEREOF

(71) Applicant: eJoule, Inc., Fremont, CA (US)

(72) Inventors: Yan Wang, Sunnyvale, CA (US); Lu Yang, Fremont, CA (US); Liang-Yuh Chen, Saratoga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/457,889

(22) Filed: Jun. 28, 2019

(65) Prior Publication Data

US 2020/0411839 A1 Dec. 31, 2020

(51) Int. Cl.

| | |
|---|---|
| ***H01M 4/04*** | (2006.01) |
| ***B05B 1/02*** | (2006.01) |
| ***H01M 10/0525*** | (2010.01) |

(52) U.S. Cl.

CPC ............ *H01M 4/0419* (2013.01); *B05B 1/02* (2013.01); *H01M 10/0525* (2013.01)

(58) Field of Classification Search

CPC .. B05B 1/00; B05B 1/02; H01M 4/00; H01M 4/02; H01M 4/04; H01M 4/0402; H01M 4/0419

See application file for complete search history.

(56) References Cited

U.S. PATENT DOCUMENTS

| | | | |
|---|---|---|---|
| 5,308,585 | A | 5/1994 | Stroder et al. |
| 5,372,096 | A | 12/1994 | Skowyra |
| 5,406,914 | A | 4/1995 | Hyppanen |
| 5,425,412 | A | 6/1995 | Hyppanen |
| 5,443,809 | A | 8/1995 | Olsen |

(Continued)

FOREIGN PATENT DOCUMENTS

| | | | |
|---|---|---|---|
| JP | 2003229124 A | * | 8/2003 |
| JP | 2003229124 A | | 8/2003 |

(Continued)

OTHER PUBLICATIONS

Machine translation of JP 2003-229124 A, published on Aug. 15, 2003 (Year: 2003).*

(Continued)

*Primary Examiner* — Natasha E Young

(74) *Attorney, Agent, or Firm* — Jas Law, LLP; Ya-Fen Chen

(57) ABSTRACT

A processing system for producing a product material from a liquid mixture includes an array of one or more power jet modules adapted to jet the liquid mixture into one or more streams of droplets and force the one or more streams of droplets into the processing system, a dispersion chamber and a reaction chamber adapted to process the one or more streams of droplets into the product material. A method for producing a product material from a liquid mixture on a processing system includes moving each of the one or more power jet modules and be connected to an opening of a dispersion chamber opening one or more doors of the one or more power jet modules, processing the one or more streams of droplets inside a reaction chamber, closing the one or more doors of the power jets modules and moving each of the one or more power jet modules in a second direction.

20 Claims, 12 Drawing Sheets

(56) References Cited

U.S. PATENT DOCUMENTS

| | | | |
|---|---|---|---|
| 5,589,300 A | 12/1996 | Fauteux et al. | |
| 5,770,018 A | 6/1998 | Saidi | |
| 5,910,382 A | 6/1999 | Goodenough et al. | |
| 5,928,405 A | 7/1999 | Ranade et al. | |
| 5,952,125 A | 9/1999 | Bi et al. | |
| 5,983,840 A | 11/1999 | Riccius et al. | |
| 6,203,944 B1 | 3/2001 | Turner et al. | |
| 6,383,235 B1 | 5/2002 | Maegawa et al. | |
| 6,409,984 B1 | 6/2002 | Hattori et al. | |
| 6,432,583 B1 | 8/2002 | Fukuda et al. | |
| 6,511,516 B1 | 1/2003 | Johnson et al. | |
| 6,582,481 B1 | 6/2003 | Erbil | |
| 6,685,762 B1 | 2/2004 | Brewster et al. | |
| 6,685,804 B1 | 2/2004 | Ikeda et al. | |
| 6,699,297 B1 | 3/2004 | Yamawaki et al. | |
| 6,699,336 B2 | 3/2004 | Turner et al. | |
| 6,770,226 B2 | 8/2004 | Hampden-Smith et al. | |
| 6,902,745 B2 | 6/2005 | Lee et al. | |
| 6,916,578 B2 | 7/2005 | Funabiki et al. | |
| 6,964,828 B2 | 11/2005 | Lu et al. | |
| 6,974,566 B2 | 12/2005 | Sabacky et al. | |
| 7,008,606 B2 | 3/2006 | Misra et al. | |
| 7,008,608 B2 | 3/2006 | Park et al. | |
| 7,211,237 B2 | 5/2007 | Eberman et al. | |
| 7,241,532 B2 | 7/2007 | Kikuchi et al. | |
| 7,381,496 B2 | 6/2008 | Onnerud et al. | |
| 7,393,476 B2 | 7/2008 | Shiozaki et al. | |
| 7,429,435 B2 | 9/2008 | Nakane et al. | |
| 7,629,084 B2 | 12/2009 | Chang | |
| 7,713,662 B2 | 5/2010 | Tabuchi et al. | |
| 7,718,319 B2 | 5/2010 | Manthiram et al. | |
| 7,771,877 B2 | 8/2010 | Paulsen et al. | |
| 7,824,802 B2 | 11/2010 | Zhang et al. | |
| 7,858,233 B2 | 12/2010 | Song et al. | |
| 8,007,941 B2 | 8/2011 | Kweon et al. | |
| 8,097,363 B2 | 1/2012 | Yuasa et al. | |
| 8,137,847 B2 | 3/2012 | Ohzuku et al. | |
| 8,153,296 B2 | 4/2012 | Jiang et al. | |
| 8,173,301 B2 | 5/2012 | Hiratsuka et al. | |
| 8,241,541 B2 | 8/2012 | Vallee et al. | |
| 8,287,829 B2 | 10/2012 | Harrison et al. | |
| 8,329,071 B2 | 12/2012 | Wang et al. | |
| 8,389,160 B2 | 3/2013 | Venkatachalam et al. | |
| 9,388,093 B2 * | 7/2016 | Luo | C07C 2/62 |
| 2002/0065374 A1 | 5/2002 | Mawson et al. | |
| 2005/0260496 A1 | 11/2005 | Ueda et al. | |
| 2009/0148764 A1 | 6/2009 | Kwak et al. | |
| 2009/0155590 A1 | 6/2009 | Kelder et al. | |
| 2009/0297947 A1 | 12/2009 | Deng | |
| 2010/0126849 A1 | 5/2010 | Lopatin et al. | |
| 2010/0151318 A1 | 6/2010 | Lopatin et al. | |
| 2010/0216026 A1 | 8/2010 | Lopatin et al. | |
| 2010/0216896 A1 | 8/2010 | Wang et al. | |
| 2010/0261071 A1 | 10/2010 | Lopatin et al. | |
| 2010/0283012 A1 | 11/2010 | Hibst et al. | |
| 2011/0037018 A1 | 2/2011 | Bruce | |
| 2011/0037019 A1 | 2/2011 | Nakano et al. | |
| 2011/0045170 A1 | 2/2011 | Shang et al. | |
| 2011/0049443 A1 | 3/2011 | Hibst et al. | |
| 2011/0052484 A1 | 3/2011 | Krampitz et al. | |
| 2011/0129732 A1 | 6/2011 | Bachrach et al. | |
| 2011/0171371 A1 | 7/2011 | Li | |
| 2011/0210293 A1 | 9/2011 | Liang et al. | |
| 2011/0217585 A1 | 9/2011 | Wang et al. | |
| 2011/0244277 A1 | 10/2011 | Gordon, II et al. | |
| 2011/0272639 A1 | 11/2011 | Bramnik et al. | |
| 2011/0274850 A1 | 11/2011 | Yang et al. | |
| 2011/0274973 A1 | 11/2011 | Sheem et al. | |
| 2011/0274976 A1 | 11/2011 | Blomgren et al. | |
| 2011/0291043 A1 | 12/2011 | Wilcox et al. | |
| 2011/0305949 A1 | 12/2011 | Nesper et al. | |
| 2012/0052347 A1 | 3/2012 | Wilson et al. | |
| 2012/0082884 A1 | 4/2012 | Orilall et al. | |
| 2012/0168686 A1 | 7/2012 | Metz et al. | |
| 2012/0280435 A1 | 11/2012 | Mao et al. | |
| 2012/0282522 A1 | 11/2012 | Axelbaum et al. | |
| 2012/0282527 A1 | 11/2012 | Amine | |
| 2012/0288617 A1 | 11/2012 | Yang et al. | |
| 2012/0321815 A1 | 12/2012 | Song et al. | |
| 2012/0321953 A1 | 12/2012 | Chen et al. | |
| 2013/0004657 A1 | 1/2013 | Xu et al. | |
| 2013/0017340 A1 | 1/2013 | Brown et al. | |
| 2013/0214200 A1 | 8/2013 | Yang et al. | |
| 2017/0305808 A1 | 10/2017 | Anderson et al. | |
| 2018/0111139 A1 | 4/2018 | Find et al. | |
| 2018/0160670 A1 * | 6/2018 | Pellenc | B05B 7/0815 |

FOREIGN PATENT DOCUMENTS

| | | |
|---|---|---|
| WO | 2009039281 A2 | 3/2009 |
| WO | 2013052456 A1 | 4/2013 |

OTHER PUBLICATIONS

Anthony Burrell et al. Applied Battery Research for Transportation. Materials Research; Modeling, Diagnostics, and Performance Studies; Abuse Diagnostics & Mitigation; and Applied Research Facilities. Argonne National Laboratory, Brookhaven National Laboratory, Idaho National Laboratory, Lawrence Berkeley National Laboratory, Oak Ridge National Laboratory, the National Renewable Energy Laboratory, Sandia National Laboratories, Army Research Laboratory, and the Jet Propulsion Laboratory. 1-194.

Gregory Krumdick et al. Argonne's Advanced Battery Materials Synthesis and Manufacturing R&D Prooram. Argonne National Laboratory, 1-5. U.S. Department of Energy, uploaded May 2, 2021.

Harshad Tataria et al. Advanced Battery Development, Systems Analysis, and Testing. Advanced Battery Development; Advanced Materials and Processing (FY 2008 FOA); Systems Analysis; Battery Testing Activities; Computer Aided Engineering of Batteries; Small Business Innovative Research Projects (SBIR), and International Collaborative Activities, 1-214.

M. Stanley Whittingham et al. Lithium Batteries and Cathode Materials. Chem. Rev. Sep. 14, 2004 4271-4301. vol. 104. American Chemical Society.

Marca M. Doeff et al. Olivines and Substituted Layered Materials. ES 052. May 10, 2011. Lawrence Berkeley National Laboratory. http:/batt.lbl.gov/battfiles/BattReview2011/es052_doeff_2011_o.pdf.

Xiaofeng Zhang et al. Flame synthesis of 5 V spinel-LiNi0.5Mn1.5O4 cathode-materials for litilium-ion rechargeable-batteries. Proceedings of the Combustion Institute. 2011. 1867-1874. vol. 33. Elsevier.

Yasuhiro Fuji et al. Structural and electrochemical properties of LiNi1/3Co1/3Mn1/3O2 Calcination temperature dependence Journal of Power Sources. Jun. 17, 2007. 894-903. vol. 171, Elsevier B.V.

PCT/US 20/39665_Notification of transmittal of the international search report and the written opinion of the International searching authority, or the declaration, dated Sep. 30, 2020.

PCT/US 20/39680_Notification of transmittal of the international search report and the written opinion of the international searching authority, or the declaration, dated Aug. 11, 2020.

PCT/US 20/40038_Notification of transmittal of the international search report and the written opinion of the international searching authority, or the declaration, dated Oct. 2, 2020.

* cited by examiner

SYSTEM WITH POWER JET MODULES AND METHOD THEREOF

FIELD OF THE INVENTION

This invention generally relates to the preparation of materials for battery applications. More specifically, the invention related to method and system in manufacturing structured cathode or anode active materials for use in secondary batteries.

BACKGROUND OF THE INVENTION

Great efforts have been devoted to the development of advanced electrochemical battery cells to meet the growing demand of various consumer electronics, electrical vehicles and grid energy storage applications in terms of high energy density, high power performance, high capacity, long cycle life, low cost and excellent safety. In most cases, it is desirable for a battery to be miniaturized, light-weighted and rechargeable (thus reusable) to save space and material resources.

In an electrochemically active battery cell, a cathode and an anode are immersed in an electrolyte and electronically separated by a separator. The separator is typically made of porous polymer membrane materials such that metal ions released from the electrodes into the electrolyte can diffuse through the pores of the separator and migrate between the cathode and the anode during battery charge and discharge. The type of a battery cell is usually named from the metal ions that are transported between its cathode and anode electrodes. Various rechargeable secondary batteries, such as nickel cadmium battery, nickel-metal hydride battery, lead acid battery, lithium ion battery, and lithium ion polymer battery, etc., have been developed commercially over the years. To be used commercially, a rechargeable secondary battery is required to be of high energy density, high power density and safe. However, there is a trade-off between energy density and power density.

Lithium ion battery is a secondary battery which was developed in the early 1990s. As compared to other secondary batteries, it has the advantages of high energy density, long cycle life, no memory effect, low self-discharge rate and environmentally benign. Lithium ion battery rapidly gained acceptance and dominated the commercial secondary battery market. However, the cost for commercially manufacturing various lithium battery materials is considerably higher than other types of secondary batteries.

In a lithium ion battery, the electrolyte mainly consists of lithium salts (e.g., LiPF6, LiBF4 or LiClO4) in an organic solvent (e.g., ethylene carbonate, dimethyl carbonate, and diethyl carbonate) such that lithium ions can move freely therein. In general, aluminum foil (e.g., 15~20 μm in thickness) and copper foil (e.g., 8~15 μm in thickness) are used as the current collectors of the cathode electrode and the anode electrode, respectively. For the anode, micron-sized graphite (having a reversible capacity around 330 mAh/g) is often used as the active material coated on the anode current collector. Graphite materials are often prepared from solid-state processes, such as grinding and pyrolysis at extreme high temperature without oxygen (e.g., graphitization at around 3000° C.). As for the active cathode materials, various solid materials of different crystal structures and capacities have been developed over the years. Examples of good cathode active materials include nanometer- or micron-sized lithium transition metal oxide materials and lithium ion phosphate, etc.

Cathode active materials are the most expensive component in a lithium ion battery and, to a relatively large extent, determines the energy density, cycle life, manufacturing cost and safety of a lithium battery cell. When lithium battery was first commercialized, lithium cobalt oxide ($LiCoO_2$) material is used as the cathode material and it still holds a significant market share in the cathode active material market. However, cobalt is toxic and expensive. Other lithium transition metal oxide materials, such as layered structured $LiMeO_2$ (where the metal Me=Ni, Mn, Co, etc.; e.g., $LiNi_{0.33}Mn_{0.33}Co_{0.33}O_2$, with their reversible/practical capacity at around 140~150 mAh/g), spinel structured $LiMn_2O_4$ (with reversible/practical capacity at around 110~120 mAh/g), and olivine-type lithium metal phosphates (e.g., $LiFePO_4$, with reversible/practical capacity at around 140~150 mAh/g) have recently been developed as active cathode materials. When used as cathode materials, the spinel structured $LiMn_2O_4$ materials exhibit poor battery cycle life and the olivine-type $LiFePO_4$ materials suffer from low energy density and poor low temperature performance. As for $LiMeO_2$ materials, even though their electrochemical performance is better, prior manufacturing processes for $LiMeO_2$ can obtain mostly agglomerates, such that the electrode density for most $LiMeO_2$ materials is lower as compared to $LiCoO_2$. In any case, prior processes for manufacturing materials for battery applications, especially cathode active materials, are too costly as most processes consumes too much time and energy, and still the qualities of prior materials are inconsistent and manufacturing yields are low.

Conventional material manufacturing processes such as solid-state reaction (e.g., mixing solid precursors and then calcination) and wet-chemistry processes (e.g., treating precursors in solution through co-precipitation, sol-gel, or hydrothermal reaction, etc., and then mixing and calcination) have notable challenges in generating nano- and micron-structured materials. It is difficult to consistently produce uniform solid materials (i.e., particles and powders) at desired particle sizes, morphology, crystal structures, particle shape, and even stoichiometry. Most conventional solid-state reactions require long calcination time (e.g., 4-20 hours) and additional annealing process for complete reaction, homogeneity, and grain growth. For example, spinel structured $LiMn_2O_4$ and olivine-type $LiFePO_4$ materials manufactured by solid-state reactions require at least several hours of calcination, plus a separate post-heating annealing process (e.g., for 24 hours), and still showing poor quality consistency. One intrinsic problem with solid-state reaction is the presence of temperature and chemical (such as $O_2$) gradients inside a calcination furnace, which limits the performance, consistency and overall quality of the final products.

On the other hand, wet chemistry processes performed at low temperature usually involve faster chemical reactions, but a separate high temperature calcination process and even additional annealing process are still required afterward. In addition, chemical additives, gelation agents, and surfactants required in a wet chemistry process will add to the material manufacturing cost (in buying additional chemicals and adjusting specific process sequence, rate, pH, and temperature) and may interfere with the final composition of the as-produced active materials (thus often requiring additional steps in removing unwanted chemicals or filtering products). Moreover, the sizes of the primary particles of the product powders produced by wet chemistry are very small, and tends to agglomerates into undesirable large sized secondary particles, thus affecting energy packing density. Also, the morphologies of the as-produced powder particles often exhibit undesirable amorphous aggregates, porous agglomerates, wires, rods, flakes, etc. Uniform particle sizes and shapes allowing for high packing density are desirable.

The synthesis of lithium cobalt oxide ($LiCoO_2$) materials is relatively simple and includes mixing a lithium salt (e.g., lithium hydroxide (LiOH) or lithium carbonate ($Li_2CO_3$)) with cobalt oxide ($Co_3O_4$) of desired particle size and then calcination in a furnace at a very high temperature for a long time (e.g., 20 hours at 900° C.) to make sure that lithium metal is diffused into the crystal structure of cobalt oxide to form proper final product of layered crystal structured $LiCoO_2$ powders. This approach does not work for $LiMeO_2$ since transition metals like Ni, Mn, and Co does not diffuse well into each other to form uniformly mixed transition metal layers if directly mixing and reacting (solid-state calcination) their transition metal oxides or salts. Therefore, conventional $LiMeO_2$ manufacturing processes requires buying or preparing transitional metal hydroxide precursor compounds (e.g., $Me(OH)_2$, Me=Ni, Mn, Co, etc.) from a co-precipitation wet chemistry process prior to making final active cathode materials (e.g., lithium NiMnCo transitional metal oxide ($LiMeO_2$)).

Since the water solubility of these $Ni(OH)_2$, $Co(OH)_2$, and $Mn(OH)_2$ precursor compounds are different and they normally precipitate at different concentrations, the pH of a mixed solution of these precursor compounds has to be controlled and ammonia ($NH_3$) or other additives has to be added slowly and in small aliquots to make sure nickel (Ni), manganese (Mn), and cobalt (Co) can co-precipitate together to form micron-sized nickel-manganese-cobalt hydroxide ($NMC(OH)_2$) secondary particles. Such co-precipitated $NMC(OH)_2$ secondary particles are often agglomerates of nanometer-sized primary particles. Therefore, the final lithium NMC transitional metal oxide ($LiMeO_2$) made from $NMC(OH)_2$ precursor compounds are also agglomerates. These agglomerates are prone to break under high pressure during electrode calendaring step and being coated onto a current collector foil. Thus, when these lithium NMC transitional metal oxide materials are used as cathode active materials, relatively low pressure has to be used in calendaring step, and further limiting the electrode density of a manufactured cathode.

In conventional manufacturing process for $LiMeO_2$ active cathode materials, precursor compounds such as lithium hydroxide (LiOH) and transitional metal hydroxide ($Me(OH)_2$ are mixed uniformly in solid-states and stored in thick $Al_2O_3$ crucibles. Then, the crucibles are placed in a heated furnace with 510° C./min temperature ramp up speed until reaching 900° to 950° C. and calcinated for 10 to 20 hours. Since the precursor compounds are heated under high temperature for a long time, the neighboring particles are sintered together, and therefore, a pulverization step is often required after calcination. Thus, particles of unwanted sizes have to be screened out after pulverization, further lowering down the overall yield. The high temperature and long reaction time also lead to vaporization of lithium metals, and typically requiring as great as 10% extra amount of lithium precursor compound being added during calcination to make sure the final product has the correct lithium/transition metal ratio. Overall, the process time for such a multi-step batch manufacturing process will take up to a week so it is very labor intensive and energy consuming. Batch process also increases the chance of introducing impurity with poor run-to-run quality consistency and low overall yield.

Thus, there is a need for an improved process and system to manufacture high quality, structured active materials for a battery cell.

SUMMARY OF THE INVENTION

This invention generally relates to system with power jet modules coupled to a dispersion chamber for producing a product material from a liquid mixture and method thereof. More specifically, the invention related to method and system for producing material particles (e.g., active electrode materials, etc) in desirable crystal structures, sizes and morphologies.

In one embodiment, the processing system with power jet modules coupled to a dispersion chamber for producing a product material from a liquid mixture is provided and includes an array of one or more power jet modules adapted to jet the liquid mixture into one or more streams of droplets and force the one or more streams of droplets into the processing system, wherein each power jet module comprises a power jet. The processing further includes the dispersion chamber adapted to be coupled to the one or more power jet modules and receive the one or more streams of droplets being dispersed with one or more gas flows therein within the dispersion chamber into a gas-liquid mixture. In one embodiment, the processing further includes a reaction chamber connected to the dispersion chamber and adapted to process the gas-liquid mixture into the product material.

In one embodiment, the dispersion chamber comprises one or more openings. And the power jet of each power jet module is adapted to be movably coupled to an opening of the dispersion chamber, wherein the first actuator is controlled by an electronic control center and is adapted to move the power jet to be correspondingly connected to an opening on the dispersion chamber.

In one embodiment, the first actuator is controlled by an electronic control center and is adapted to move the power jet to be correspondingly connected to an opening on the dispersion chamber. Further, the power jet of each power jet module is moved by the first actuator of the power jet module to be positioned at a first position being connected to the opening of the dispersion chamber. In one embodiment, each power jet module further includes a sealing element to seal each power jet module with the opening of the dispersion chamber at the first position and a door such that the power jet is adapted to be positioned in a closed position and in an open position via a second actuator. Further, the power jet of each power jet module is moved by the first actuator of the power jet module to be positioned at a second position being away from the opening of the dispersion chamber.

In one embodiment, the power jet of the processing system further includes an array of one or more nozzle orifices, each orifice is adapted to jet the liquid mixture into one or more streams of droplets. In one embodiment, the power jet module of the processing system further includes a cleaning assembly. The cleaning assembly of each power jet module further includes a movable cleaning blade element and a movable suction element. In one embodiment, the processing system further includes a buffer chamber having a gas distributor with one or more channels therein for forming one or more carrier gases into one or more gas flows. The processing system further includes an electronic control center.

In an alternative embodiment, the processing system with power jet modules coupled to a dispersion chamber for producing a product material from a liquid mixture is provided and includes an array of the one or more power jet modules adapted to jet the liquid mixture into one or more streams of droplets, wherein each power jet module comprises a power jet and a support frame for supporting the movement of the power jet, and the dispersion chamber adapted to be connected to the one or more power jet modules and receive the one or more streams of droplets therein, and wherein the power jet of each power jet module is adapted to be positioned at a first position to be connected to an opening of the dispersion chamber and at a second position to be away from the opening of the dispersion chamber. In the embodiment, the processing system further includes a reaction chamber connected to the dispersion chamber and adapted to process the one or more streams of droplets into the product material.

In still another embodiment, a method of producing a product material form a liquid mixture with power jet modules coupled to a dispersion chamber is provided and includes moving each of the one or more power jet modules in a first direction to be positioned at a first position and be connected to an opening of a dispersion chamber of a processing system, matching each of the one or more power jets modules to each of one or more openings on the dispersion chamber, and opening one or more doors of the one or more power jet modules. The method further includes processing the one or more streams of droplets inside a reaction chamber of the processing system, closing the one or more doors of the power jets modules and moving each of the one or more power jet modules in a second direction to be positioned at a second position and be away from the opening of the dispersion chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides a process system with power jet modules coupled to a dispersion chamber and method thereof. The process system includes an array of one or more jet modules, a dispersion chamber, and a reaction chamber. The process system is useful in performing a continuous process to manufacture a particulate material, save material manufacturing time and energy, and solve the problems of high manufacturing cost, low yield, poor quality consistency, low electrode density, low energy density as seen in conventional active material manufacturing processes.

In one aspect, a liquid mixture, which can be a metal-containing liquid mixture, is promptly jetted into streams of droplets by power jets of the power jet modules and then dispersed into the dispersion chamber. The streams of droplets are continuously mixed with a gas to form a gas-liquid mixture which is then delivered into and reacted in a reaction chamber. Alternatively, the streams of droplets are delivered into and reacted in a reaction chamber.

In another aspect, a flow of air or gas is served as a gas source for forming a gas-liquid mixture with the liquid mixture, and as a carrying gas for delivering the gas-liquid mixture from the dispersion chamber to the reaction chamber. The gas can also serve as energy source for the gas-liquid mixture to react in the reaction chamber, if such gas is heated before entering into the dispersion chamber.

Reaction products from the reaction chamber are delivered out of the reaction chamber. The reaction products usually contain solid material particles or fine powers of an oxidized form of the liquid mixture composition (e.g., a metal oxide material, such as fine powers of a mixed metal oxide material), with desired crystal structure, particle size, and morphology. Accordingly, high quality and consistent active particulate materials can be obtained with much less time, labor, and supervision than materials prepared from conventional manufacturing processes.

Figure 1:
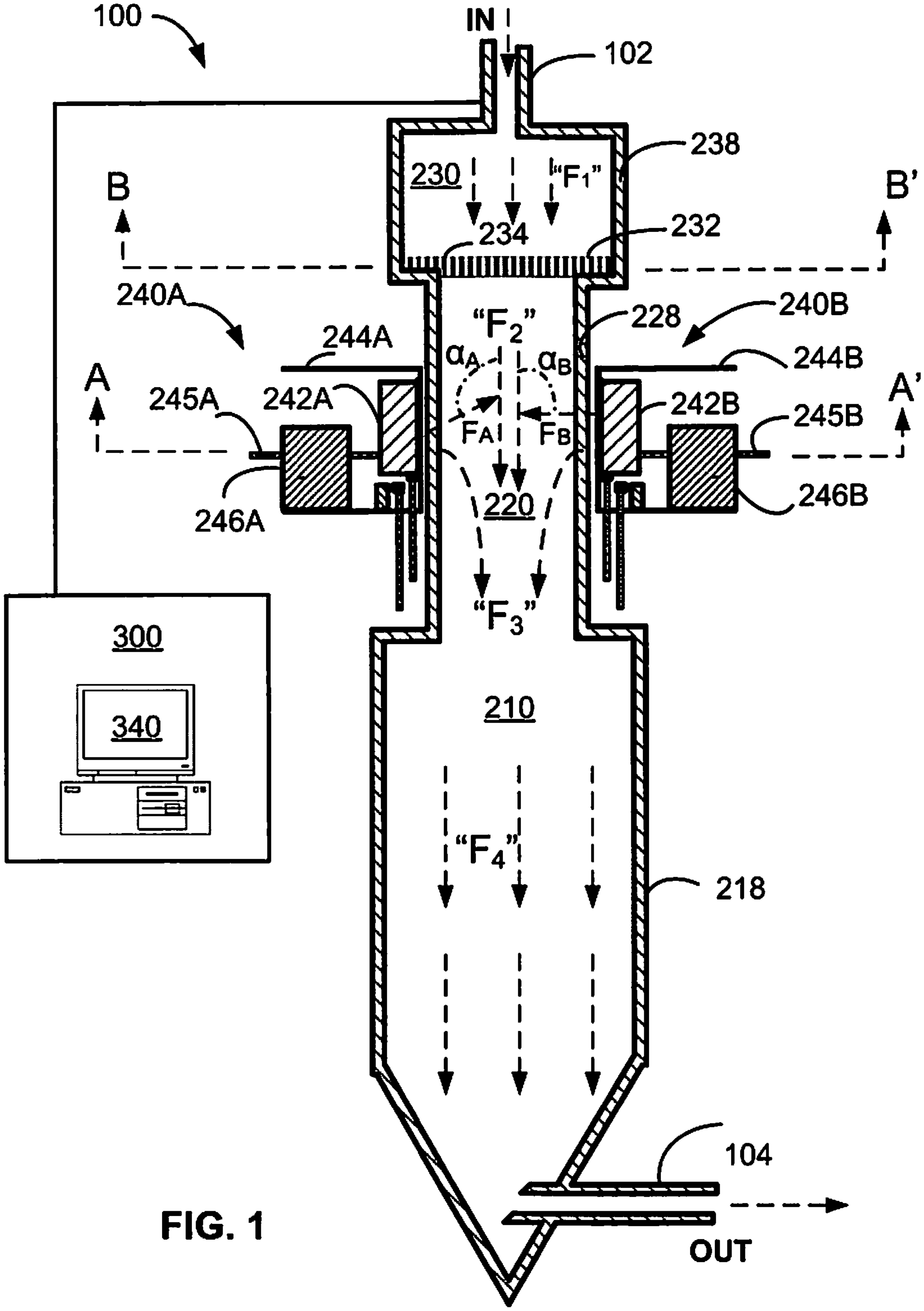
FIG. 1A is a perspective view of one embodiment of a system with power jet modules coupled to a dispersion chamber for producing a product material from a liquid mixture.
FIG. 1B is a cross-section view of one embodiment of a system with power jet modules coupled to a dispersion chamber for producing a product material from a liquid mixture.
Figure 1A:
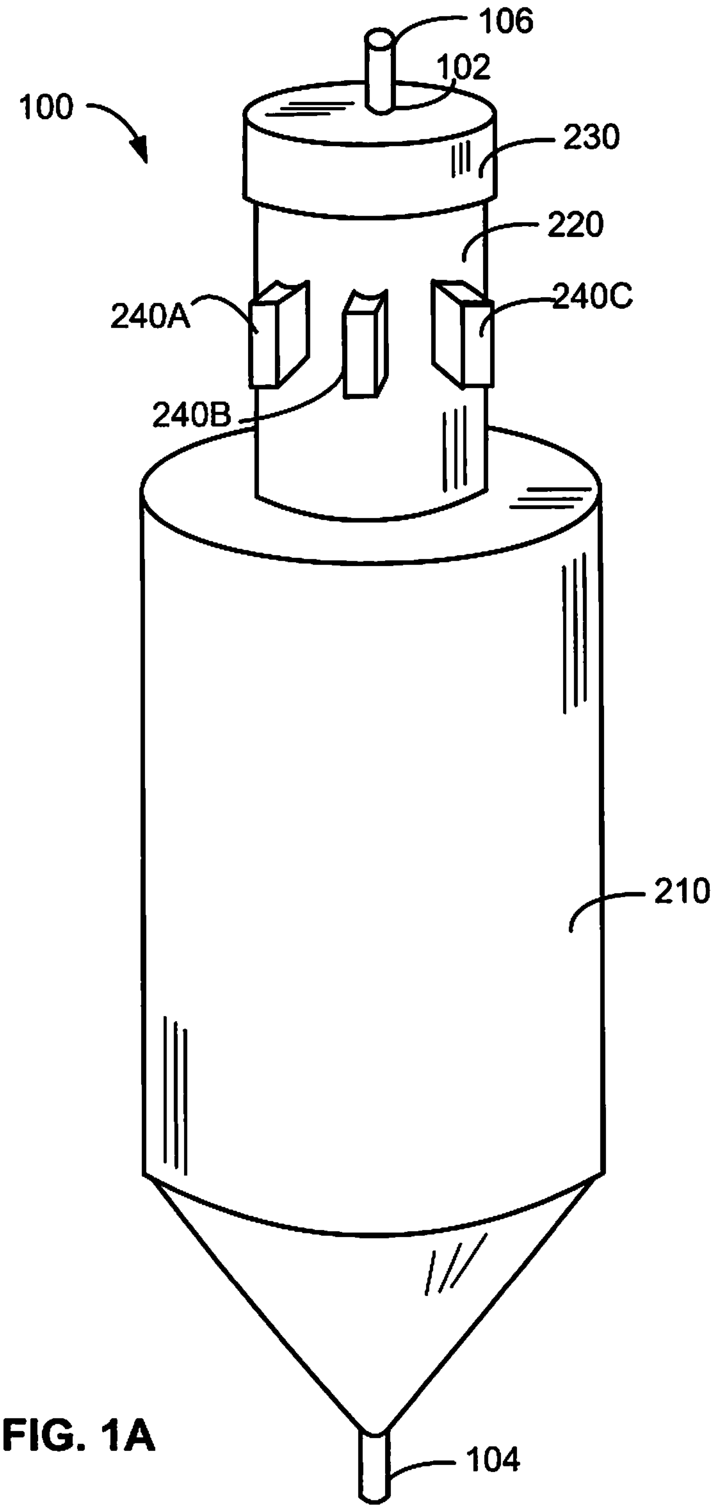

System with Power Jet Modules Coupled to a Dispersion Chamber for Producing a Product Material from a Liquid Mixture FIG. 1A is a perspective view of one embodiment of a processing system 100 for producing a particulate material. This exemplary embodiment of the processing system 100 includes a system inlet 102 for delivering one or more gases through gas line 106 and system outlet 104 for delivering particulate material out of the processing system. The one or more gases may be selected from gas source of air, oxygen, carbon dioxide, nitrogen gas, hydrogen gas, inert gas, noble gas, and combinations thereof, among others.

The processing system 100 includes a system inlet 102 for delivering the one or more gases into the processing system, a buffer chamber 230 connected to the system inlet 102, dispersion chamber 220 connected to the buffer chamber 230, a reaction chamber 210 connected to the dispersion chamber 220, and a system outlet 104 connected to the reaction chamber 210. In one embodiment, the processing system 100 further includes an array of one or more power jet modules 240A, 240B, 240C, 240D, etc., for jetting the liquid mixture into one or more streams of droplets and to force the one or more streams of droplets into the processing system 100. The processing system further includes a reaction chamber for processing the one or more streams of droplets and the one or more gases into the particulate material.

The liquid mixture is prepared from two or more precursor compounds and then converted into droplets, each droplet will have the two or more precursors uniformly distributed together. Then, the moisture of the liquid mixture is removed by passing the droplets through the dispersion chamber 220 and the flow of the gas is used to carry the mist within the dispersion chamber for a suitable residence time. It is further contemplated that the concentrations of the precursor compounds in a liquid mixture and the droplet sizes of the mist of the liquid mixture can be adjusted to control the chemical composition, particle sizes, and size distribution of final product particles of the battery material.

In another embodiment, the processing system 100 further includes, as illustrated by FIG. 1A, at least one buffer chamber (e.g., a buffer chamber 230) configured to be connected to a system inlet 102 for delivering one or more gases from one or more gas sources into multiple uniform gas flows.

In a further embodiment, the processing system 100 also includes the dispersion chamber 220, and power jet modules 240A, 240B and 240C for preparing precursor liquid mixture into desirable size and delivering the desired precursor liquid mixture into the processing system. The power jet modules can be attached to a portion of the dispersion chamber to and employ air pressure to jet the liquid mixture and convert it into a mist containing small sized droplets directly inside the dispersion chamber. Alternatively, a mist can be generated outside the dispersion chamber and delivered into the dispersion chamber. Suitable droplet sizes can be adjusted according to the choice of the power jet module used, the liquid mixture compounds, the temperature of the dispersion chamber, the flow rate of the gas, and the residence time inside the dispersion chamber. As an example, a mist with liquid droplet sizes between one tenth of a micron and one millimeter is generated inside the dispersion chamber.

In one example, the power jet module 240A is coupled to a portion of the dispersion chamber 220 to generate a mist (e.g., a large collection of small size droplets) of the liquid mixture directly within the dispersion chamber. In general, the power jet module 240A is able to generate a mist of mono-sized droplets. In one embodiment, the dispersion chamber 220 is connected to the one or more power jet modules 240A, 240B and 240C, for receiving multiple uniform gas flows from the buffer chamber and dispersing the multiple uniform gas flows with one or more streams of droplets jetted from the array of one or more power jet modules 240A, 240B and 240C into each other.

In another example, the dispersion chamber 220 then connects to the reaction chamber 210 for processing the one or more streams of droplets and the one or more gases into the particulate material. Further, the reaction chamber 210 connects to the system outlet 104 for delivering the particulate material out of the processing system.

FIG. 1B is a cross-sectional view of an exemplary processing system 100 that can be used to carry out a fast, simple, continuous and low-cost manufacturing process for producing a particulate material. In one embodiment, the processing system 100 further includes a gas distributor 232 attached to chamber wall 238 of the buffer chamber 230, channels of the distributor 232 for delivering the one or more gases F1 into multiple uniform gas flows F2 inside the processing system, dispersion chamber 220 and one or more power jet modules 240A and 240B attached to chamber wall 228 of the dispersion chamber 220.

In one embodiment, the one or more gases $F_1$ delivered into the buffer chamber 230 is pressured downward to flow at a certain speed through channels 234 of the gas distributor 232 into multiple uniform gas flows F2 out of the channels 234 and into the dispersion chamber 220. In one embodiment, the one or more gases $F_1$ may be pumped through an air filter to remove any particles, droplets, or contaminants, and the flow rate of the gas can be adjusted by a valve or other means. In one embodiment, the flow rate of multiple uniform gas flows $F_2$ coming out of the channels 234 will be higher than the flow rate of one or more gases $F_1$. Additionally, the direction of multiple uniform gas flows $F_2$ will be gathered and unified.

In one embodiment, the power jet module 240A include a power jet 242A for jetting a liquid mixture supplied to the power jet module 240A into one or more streams of droplets. The power jet module 240A further includes a support frame 244A for supporting the power jet module 240A, a module actuator 246A attached to the inner side of the support frame 244A for actuating and forcing the one or more streams of droplets $F_A$ jetted from the power jets 242A attached to the inner side of the support frame 244A into the dispersion chamber 220, and a connector 245A connecting the module actuator 246A and power jet 242A. Additionally, the power jet module 240B include a power jet 242B for jetting a liquid mixture supplied to the power jet module 240B into one or more streams of droplets. The power jet module 240B further includes a support frame 244B for supporting the power jet module 240B, a module actuator 246B attached to the inner side of the support frame 244B for actuating and forcing the one or more streams of droplets $F_B$ jetted from the power jets 242B attached to the inner side of the support frame 244B into the dispersion chamber 220, and a connector 245B connecting the module actuator 246B and power jet 242B.

In one embodiment, the streams of droplets $F_A$ jetted into the dispersion chamber 220 are dispersed with multiple uniform gas flows F2 in a dispersion angle $\alpha_A$ with each other and forming a gas-liquid mixture $F_3$ containing the multiple uniform gas flows $F_2$ and the streams of droplets $F_A$. Further, the streams of droplets $F_B$ jetted into the dispersion chamber 220 are dispersed with multiple uniform gas flows F2 in a dispersion angle $\alpha_B$ with each other and forming a gas-liquid mixture $F_3$ containing the multiple uniform gas flows $F_2$ and the streams of droplets $F_B$. In one embodiment, the dispersion chamber maintained itself at a first temperate.

In another embodiment, the one or more gases is heated to a drying temperature to mix with the streams of droplets and remove moisture from the streams of droplets. It is designed to obtain spherical solid particles from a thoroughly-mixed liquid mixture of two or more liquid mixture after drying the mist of the liquid mixture. In contrast, conventional solid-state manufacturing processes involve mixing or milling a solid mixture of liquid mixture compounds, resulting in uneven mixing of liquid mixtures.

The one or more gas may be, for example, air, oxygen, carbon dioxide, nitrogen gas, hydrogen gas, inert gas, noble gas, and combinations thereof, among others. For example, heated air can be used as an inexpensive gas source and energy source for drying the streams of droplets. The choice of the one or more gas may be a gas that mix well with the streams of droplets of the precursors and dry the mist without reacting to the precursors. In some cases, the chemicals in the streams of droplets may react to the one or more gases and/or to each other to certain extent during drying, depending on the drying temperature and the chemical composition of the precursors. In addition, the residence time of the streams of droplets of thoroughly mixed precursor compounds within the dispersion chamber is adjustable and may be, for example, between one second and one hour, depending on the flow rate of the one or more gas, and the length of the path that the streams of droplets has to flow dispersion within the dispersion chamber.

In one embodiment, the processing system 100 further includes the reaction chamber 210 for receiving the gas-liquid mixture $F_3$ and performing a desired reaction of the gas-liquid mixture $F_3$ into a final reaction product $F_4$ at a second temperature and for a duration of a reaction time. Lastly, the final reaction products F4, which can be product particles, can be delivered out of the system 100 through system outlet 104 for further analysis on their properties (e.g., specific capacity, power performance, particulate charging cycle performance, etc.), particle sizes, morphology, crystal structure, etc., to be used as a particulate material.

Optionally, in one embodiment, the reaction chamber 210 is a circulating-type fluidized bed reactor for receiving the gas-liquid mixture $F_3$ from the dispersion chamber and mixing it with a flow of pre-heated second gas to form a final reaction product $F_4$ within the internal volume of the reaction chamber 210. The final reaction product $F_4$ is heated by the thermal energy of the preheated second gas and complete reaction is enhanced by continuously flowing the final reaction product $F_4$ out of the reaction chamber 210 into a gas-solid separator coupled to the reaction chamber 210. The gas-solid separator is provided to remove side products (and/or a portion of reaction products) out of the system 100 via a separator outlet and recirculating solid particles back into the reaction chamber 210 via a separator outlet. Product particles with desired sizes, crystal structures, and morphology are collected and delivered out of the gas-solid separator via a separator outlet.

Optionally, in another embodiment, the reaction chamber 210 is a bubbling-type fluidized bed reactor. A flow of pre-heated second gas from the gas line is delivered into the reaction chamber 210 and passes through a porous medium to mix with the gas-liquid mixture $F_3$ delivered from the dispersion chamber 220 and generate a bubbling gaseous fluid-solid mixture within the internal volume of the reaction chamber. The bubbling gas-solid mixture is heated by the thermal energy of the preheated second gas and complete reaction is enhanced by bubbling flows within the reaction chamber 210. Upon complete reaction, gaseous side products are removed out of the reaction chamber 210 via a reactor outlet. Final reaction product $F_4$ with desired crystal structures, morphology, and sizes are collected and delivered out of the reaction chamber 210 via the system outlet 104.

Optionally, in another embodiment, the reaction chamber 210 is an annular-type fluidized bed reactor. A flow of pre-heated second gas from the gas line is delivered into the reaction chamber 210 and also diverted into additional gas flows, such as gas flows, to encourage thorough-mixing of the heated gas with the gas-liquid mixture $F_3$ delivered from the dispersion chamber 220 and generate a uniformly mixed gas-solid mixture within the internal volume of the reactor reaction chamber. Upon complete reaction, gaseous side products are removed out of the reaction chamber 210 via the reactor outlet. Product particles with desired crystal structures, morphology, and sizes are collected and delivered out of the reaction chamber 210 via the system outlet 104.

Optionally, in another embodiment, the reaction chamber 210 is a flash-type fluidized bed reactor. The reaction chamber 210 receives the gas-liquid mixture $F_3$ from the dispersion chamber 220 and mixes it with a flow of pre-heated gas from the gas line to form a gas-solid mixture. The gas-solid mixture is passed through a tube reactor body which is coupled to the reaction chamber 210. The gas-solid mixture has to go through the long internal path, which encourages complete reaction using the thermal energy of the heated gas. Gaseous side products are then removed out of the reaction chamber 210 via the reactor outlet, and product particles with desired crystal structures, morphology, and sizes are collected and delivered out of the reaction chamber 210 via the system outlet 104. It is noted that additional gas lines can be used to deliver heating or cooling air or gas into the reaction chamber 210.

In one embodiment, final reaction product F4 includes a metal oxide material, a doped metal oxide material, an inorganic metal salts, among others. Exemplary metal oxide materials include, but are not limited to, titanium oxide ($Ti_xO_y$, such as $Ti_2O_5$), chromium oxide ($Cr_xO_y$, such as $Cr_2O_7$), tin oxide ($Sn_xO_y$, such as $SnO_2$, SnO, $SnSiO_3$, etc.), copper oxide ($Cu_xO_y$, such as CuO, $Cu_2O$, etc), aluminum oxide ($Al_xO_y$, such as $Al_2O_3$,), manganese oxide ($Mn_xO_y$), iron oxide ($Fe_xO_y$, such as $Fe_2O_3$, etc), among others. For mixed metal oxide materials, it is desired to control the composition of a final reaction product material by the ratio of the liquid mixture compounds added in a liquid mixture added to the processing system 100. In one embodiment, a metal oxide with two or more metals ($Me_xMe'_yO_z$) is obtained. Examples include lithium transitional metal oxide ($LiMeO_2$), lithium titanium oxide (e.g., $Li_4Ti_5O_{12}$), lithium cobalt oxide (e.g., $LiCoO_2$), lithium manganese oxide (e.g., $LiMn_2O_4$), lithium nickel oxide (e.g., $LiNiO_2$), lithium iron phosphate (e.g., $LiFePO_4$), lithium cobalt phosphate (e.g., $LiCoPO_4$), lithium manganese phosphate (e.g., $LiMnPO_4$), lithium nickel phosphate (e.g., $LiNiPO_4$), sodium iron oxide (e.g., $NaFe_2O_3$), sodium iron phosphate (e.g., $NaFeP_2O_7$), among others.

In another embodiment, final reaction product $F_4$ includes a metal oxide with three or four intercalated metals. Exemplary metal oxide materials include, but are not limited to, lithium nickel cobalt oxide (e.g., $L_xNi_yCo_zO_2$), lithium nickel manganese oxide (e.g., $Li_xNi_yMn_zO_2$, $Li_xNi_yMn_zO_4$, etc.), lithium nickel manganese cobalt oxide (e.g., $Li_aNi_bMn_cCo_dO_e$ in layered structures or layered-layered structures; and/or $LiNi_xMn_yCo_zO_2$, a NMC oxide material where x+y+z=1, such as $LiNi_{0.33}Mn_{0.33}Co_{0.33}O_2$, $LiNi_{0.6}Mn_{0.2}Co_{0.2}O_2$, $LiNi_{0.5}Mn_{0.3}Co_{0.2}O_2$, $LiNi_{0.4}Mn_{0.4}Co_{0.2}O_2$, $LiNi_{0.7}Mn_{0.15}Co_{0.15}O_2$, $LiNi_{0.8}Mn_{0.1}Co_{0.1}O_2$, etc.; and/or a mixed metal oxide with doped metal, among others. Other examples include lithium cobalt aluminum oxide (e.g., $Li_xCo_yAl_zO_n$), lithium nickel cobalt aluminum oxide (e.g., $Li_xNi_yCo_zAl_aO_b$), sodium iron manganese oxide (e.g., $Na_xFe_yMn_zO_2$), among others. In another example, a mixed metal oxide with doped metal is obtained; for example. $Li_a(Ni_xMn_yCo_z)MeO_b$ (where Me=doped metal of Al, Mg, Fe, Ti, Cr, Zr, or C), $Li_a(Ni_xMn_yCo_z)MeO_bF_c$ (where Me=doped metal of Al, Mg, Fe, Ti, Cr, Zr, or C), among others.

Other metal oxide materials containing one or more lithium (Li), nickel (Ni), manganese (Mn), cobalt (Co), aluminum (Al), titanium (Ti), sodium (Na), potassium (K), rubidium (Rb), vanadium (V), cesium (Cs), copper (Cu), magnesium (Mg), iron (Fe), among others, can also be obtained. In addition, the metal oxide materials can exhibit a crystal structure of metals in the shape of layered, spinel, olivine, etc. In addition, the morphology of the final reaction product $F_4$ exists as desired solid powders. The particle sizes of the solid powders range between 10 nm and 100 um.

In one embodiment, the processing system 100 is connected to an electronic control unit 300 including a CPU 340 for automatic control of the processing system 100. The electronic control unit 300 adjusts various process parameters (e.g., flow rate, mixture ratio, temperature, residence time, etc.) within the system 100. For example, the flow rate of the liquid mixture into the system 100 can be adjusted. As another example, the droplet size and generation rate of the one or more streams of droplets generated by the power jet modules can be adjusted. In addition, flow rate and temperature of various gases flown within the gas lines 102 can be controlled by the electronic control unit 300. In addition, the electronic control unit 300 is adapted to control the temperature and the residence time of various gas-liquid mixture and solid particles at desired level at various locations.

Optionally, in one embodiment, the processing system 100 further includes a first separator connected to the dispersion chamber 230 and adapted to collecting and separating the gas-liquid mixture $F_3$ from the dispersion chamber into a first type of solid particles and waste products. Optionally, the first separator is connected to a drying chamber which is connected to the dispersion chamber 230 and adapted to collecting and drying the gas-liquid mixture $F_3$ from the dispersion chamber into a gas-solid particles to be delivered and separated into a first type of solid particles and waste products within the first separator. In one embodiment, the first separator further includes a first separator outlet connected to the reaction chamber 210 and adapted to deliver the first type of solid particles into the reaction chamber 210, and a second separator outlet adapted to deliver waste products out of the first separator.

In one embodiment, final reaction product $F_4$ is collected and cooled by one or more separators, cooling fluid lines, and/or heat exchangers, and once cooled, out of the system 100. The final reaction product $F_4$ may include oxidized form of liquid mixtures, such as an oxide material, suitable to be packed into a battery cell. Additional pumps may also be installed to achieve the desired pressure gradient.

Figure 2A:
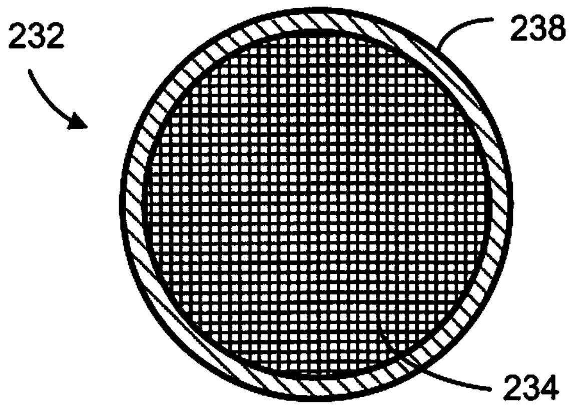
FIG. 2A is a cross-sectional view of an apparatus that can be used in a system with power jet modules coupled to a dispersion chamber for producing a product material from a liquid mixture.

FIG. 2A is a cross-sectional view of the buffer chamber 230 for performing a process of preparing a particulate material according to one embodiment of the invention. Referring back to FIG. 1, the buffer chamber 230 in FIG. 2A is sectioned by dashed line BB'. In one embodiment, the buffer chamber 230 includes a cylinder gas distributor 232 for delivering one or more gases from the system inlet into multiple unified gases, surrounded within the inner side of chamber wall 238 of the buffer chamber 230 and positioned at the bottom portion of the buffer chamber 230, and channels 234 of the gas distributor 232 for passing the one or more gases in a unified direction and at a flow rate.

Figure 2B:
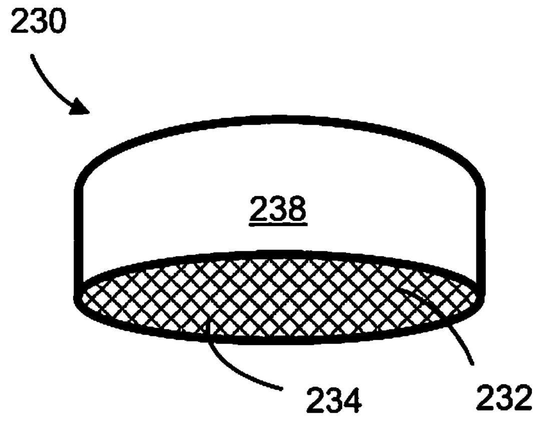
FIG. 2B is a perspective view of the dispersion chamber of said apparatus in FIG. 2A that can be used in a system with power jet modules coupled to a dispersion chamber for producing a product material from a liquid mixture.

FIG. 2B is a perspective view of the buffer chamber 230, which includes the cylinder gas distributor 232, surrounded within the chamber wall 238 of the buffer chamber 230, and channels 234 of the gas distributor 232.

Figure 2C:
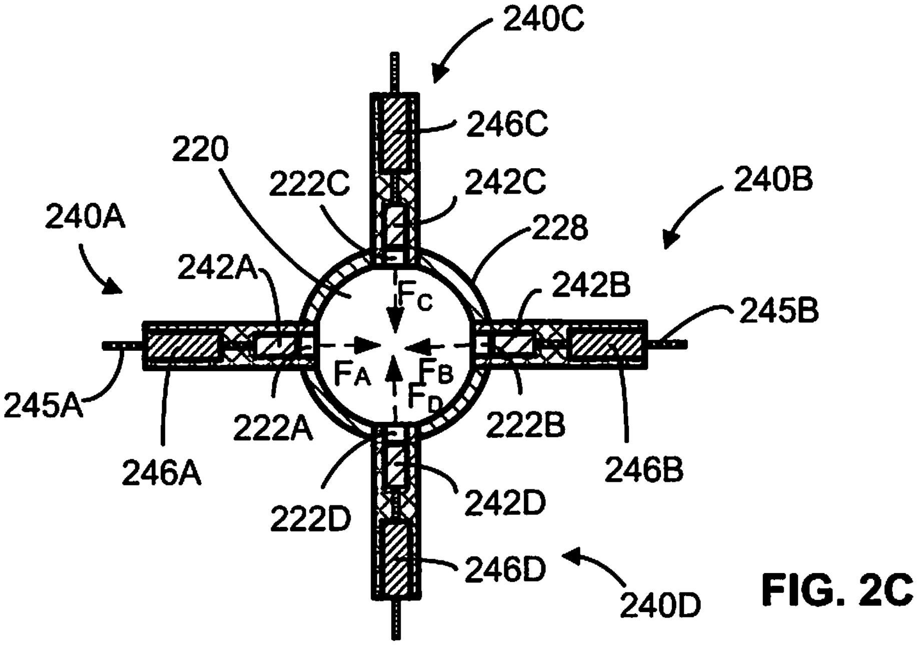
FIG. 2C is a cross-sectional view of the dispersion chamber of said apparatus can be used in a system with power jet modules coupled to a dispersion chamber for producing a product material from a liquid mixture.

FIG. 2C is a cross-sectional view of the dispersion chamber 220 configured in the processing system 100 according to one embodiment of the invention. Referring back to FIG. 1, the dispersion chamber 220 in FIG. 3A is sectioned by dashed line AA'. The dispersion chamber 220 is enclosed by a chamber wall 228.

In one embodiment, an array of one or more power jet modules, individually power jet module 240A, power jet module 240B, power jet module 240C and power jet module 240D, is positioned on one or more opening 222A, 222B, 222C and 222D of the chamber wall 228 of the dispersion chamber 220. In one embodiment, power jet modules 240A-240D can be attached to chamber wall 228 of the dispersion chamber 220 in one arrangement shown in FIG. 3A. The arrangement can be each of four power jet being configured to the chamber wall 228 in an evenly distance adjacent to each other on a same horizontal line of the chamber wall 228.

In one embodiment, the power jet module 240A include a power jet 242A for jetting a liquid mixture supplied to the power jet module 240A into one or more streams of droplets. The power jet module 240A further includes a support frame 244A for supporting the power jet module 240A, a module actuator 246A attached to the inner side of the support frame 244A for actuating and forcing the one or more streams of droplets $F_A$ jetted from the power jets 242A attached to the inner side of the support frame 244A into the dispersion chamber 220, and a connector 245A connecting the module actuator 246A and power jet 242A. Similarly, the power jet module 240B include a power jet 242B, a support frame 244B, a module actuator 246B, and a connector 245B. Similarly, the power jet module 240C include a power jet 242C, a support frame 244C, a module actuator 246C and a connector 245C. Also, the power jet module 240D include a power jet 242D, a support frame 244D, a module actuator 246D and a connector 245D.

In one embodiment, power jets 242A-242D are positioned near the top of the dispersion chamber 220 that is positioned vertically (e.g., a dome-type dispersion chamber, etc.) to inject the streams of droplets $F_{A-D}$ into the dispersion chamber 220 and pass through the dispersion chamber vertically downward. Alternatively, power jets 242A-242D can be positioned near the bottom of the dispersion chamber 220 that is vertically positioned and be able to inject the streams of droplets upward (which can be indicated as FIG. 3B) into the dispersion chamber to increase the residence time of the streams generated therein. In another embodiment, when the dispersion chamber 220 is positioned horizontally (e.g., a tube dispersion chamber, etc.) and the power jets 242A-242D are positioned near one end of the dispersion chamber 220 such that a flow of the mist, being delivered from the one end through another end of the dispersion chamber 220, can pass through a path within the dispersion chamber 220 for the length of its residence time.

Aside from streams of liquid mixture, the dispersion chamber 220 is also filled with gas flows. The gas distributor 232 is coupled to the end portion of the buffer chamber and adapted to flow multiple unified gases $F_2$ into the dispersion chamber 220. A flow of multiple unified gases $F_2$ can be delivered, concurrently with the formation of the streams of droplets inside dispersion chamber 220, into the dispersion chamber 220 to carry the streams of droplets through the dispersion chamber 220, may or may not remove moisture from the mist, and form a gas-liquid mixture with a direction $F_3$ containing the liquid mixtures. Also, the flow of multiple unified gases $F_2$ can be delivered into the dispersion chamber 220 prior to the formation of the mist to fill and preheat to a first temperature an internal volume of the dispersion chamber 220 prior to generating the streams of droplets inside the dispersion chamber 220.

In one example, the gas distributor 232 is connected to the end portion of the buffer chamber 230 which connects to the top portion of the dispersion chamber 310 to deliver the multiple unified gases $F_2$ into the dispersion chamber 220 to be mixed with the streams of droplets generated by the power jet module attached to the chamber wall 228 of the dispersion chamber 220. In one embodiment, the multiple unified gases $F_2$ is preheated to a temperature of between 70° C. and 600° C. to mix with and remove moisture from the streams of droplets. In another embodiment, the multiple unified gases $F_2$ is not preheated and used to ensure the gas-liquid mixture formed within the dispersion chamber 220 is uniformly mixed with the gas.

Figure 2D:
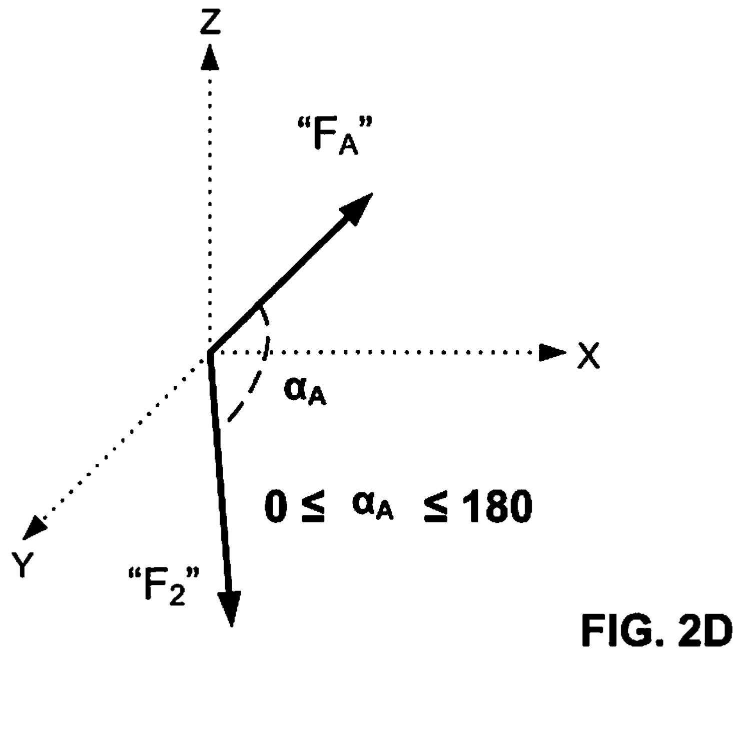
FIG. 2D illustrate the angle between a gas flow and a stream of droplets inside the dispersion chamber according to one embodiment of the invention.
Figure 2E:
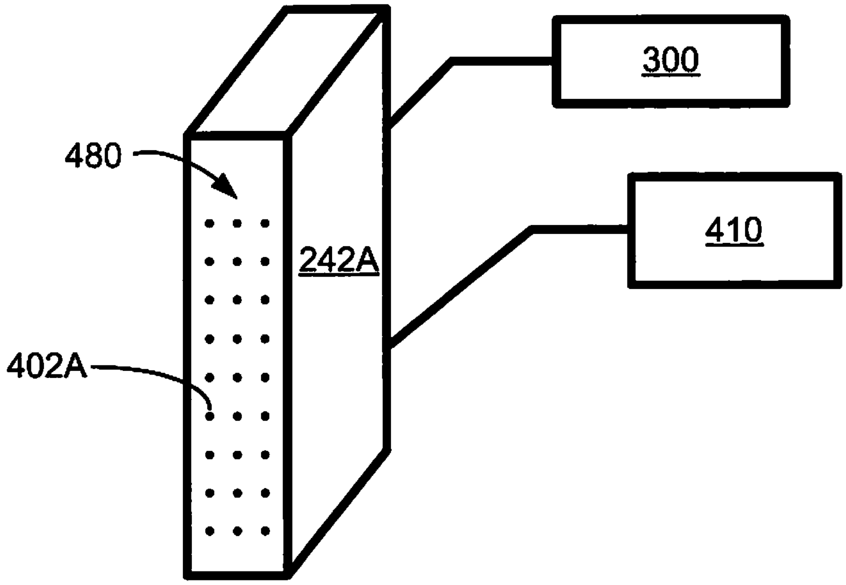
FIG. 2E is a perspective view of a power jet and orifices thereon according to one embodiment of the invention.

FIG. 2D illustrate the dispersion angle of multiple unified gases F2 and stream of droplets $F_A$ inside the dispersion chamber 220 configured in the processing system 100 of FIG. 1 according to one embodiment of the invention.

FIG. 2D indicates inside the dispersion chamber 220, the streams of droplets $F_A$ is dispersed into the multiple unified gases $F_2$ at a dispersion angle $\alpha_A$. The dispersion angle $\alpha_A$ is measured according to the angle between of the direction of the streams of droplets $F_A$ and the multiple unified gases $F_2$ on a vertical Z-axis, while in a 3D perspective view of a XYZ-axis setting.

In one embodiment, the flows of the streams of droplets of the liquid mixture (e.g., the streams of droplets $F_A$) and the flows of the gas (e.g., the multiple unified gases $F_2$) may encounter with each other inside the dispersion chamber at an angle of 0 degree to 180 degrees. In addition, the air streams of the streams of droplets flow $F_A$ and the gas flow $F_2$ may be flown in straight lines, spiral, intertwined, and/or in other manners.

In one embodiment, the stream of droplets $F_A$ and the multiple unified gases $F_2$ are configured at an $\alpha_A$ angle ($0 \leq \alpha_A \leq 180°$) and can merge into a mixed flow inside the dispersion chamber (e.g., co-currents) inside the dispersion chamber. In addition, the stream of droplets flow $F_A$ and the multiple unified gases $F_2$ may be flown at various angles directed to each other and/or to the perimeter of the chamber body to promote the formation of spiral, intertwined, and/or other air streams inside the dispersion chamber 220. In one embodiment, the streams of droplets and the gas flow are configured at an $\alpha$ angle of less than 90 degrees and can merge into a mixed flow inside the dispersion chamber. In another embodiment, the droplets streams flow $F_A$ and the gas flow $F_2$ are configured at an $\alpha$ angle of 90 degrees and can merge into a mixed flow inside the dispersion chamber. In addition, the droplets streams flow $F_A$ and the gas flow $F_2$ may be flown at various angles directed to each other and/or to the perimeter of the chamber body to promote the formation of spiral, intertwined, and/or other air streams inside the dispersion chamber 220.

For example, the flow of the gas and the flow of the stream of droplets flowing inside the dispersion chamber can be configured to flow as co-currents, as shown in the examples of FIG. 3B. Advantages of co-current flows are shorter residence time, lower particle drying temperature, and higher particle separation efficiency, among others. In another embodiment, the flow of the multiple unified gases and the flow of the streams of droplets flowing inside the dispersion chamber can be configured to flow as counter currents, also shown in FIG. 3B. Advantage of counter currents are longer residence time and higher particle drying temperature, among others.

In another embodiment, the droplets streams flow $F_A$ and the gas flow $F_2$ are configured at an $\alpha$ angle of 180 degrees and are flown as counter currents. In an alternative embodiment, the dispersion chamber 220 can be positioned horizontally. Similarly, the droplets streams flow $F_A$ and the gas flow $F_2$ can be configured at an a angle of between 0 degree and 180 degrees. Referring back to FIG. 1, once the droplets stream of the liquid mixture is formed into a gas-liquid mixture with the gas, the gas-liquid mixture is delivered through the dispersion chamber 220 to the reaction chamber 210.

FIG. 2F is a perspective view of a power jet according to one embodiment of the invention. The power jet 242A is connected to a liquid source 720 to store desired amounts of liquid mixture compounds and an electronic control unit 300 for directing and controlling the delivery of liquid mixture compounds from the liquid source 720 to the power jet 242A.

In another configuration, the liquid mixture within the liquid source 720 can be pumped by the pump from the liquid source 720 to the power jet 242A. Pumping of the liquid mixture by the pump can be configured, for example, continuously at a desired delivery rate (e.g., adjusted by a metered valve or other means) to achieve good process throughput of processing system 100. In another configuration, the power jet 242A is positioned outside the dispersion chamber 220 and the stream generated therefrom is delivered to the dispersion chamber 220 via a chamber inlet.

In one embodiment, the power jet 242A is in a cuboid structure having six rectangular faces at right angles to each other. Further the power jet 242A consists a nozzle array 480A on one side face of the power jet 242A. In one embodiment, the nozzle array 480A is on the side face of the power jet 242A with a bottom width shorter than the side length, and consists of 3*10 evenly placed orifices 402A forming a rectangular form. In another embodiment, the nozzle array 480A consists of another patterns of orifices.

In another embodiment, the power jet is in a different shape and structure, e.g. a cylinder structure with straight parallel sides and a circular or oval section. Further the power jet consists a nozzle array on one side straight parallel side of the power jet. In one embodiment, the nozzle array consists of a single orifice.

Figure 3:
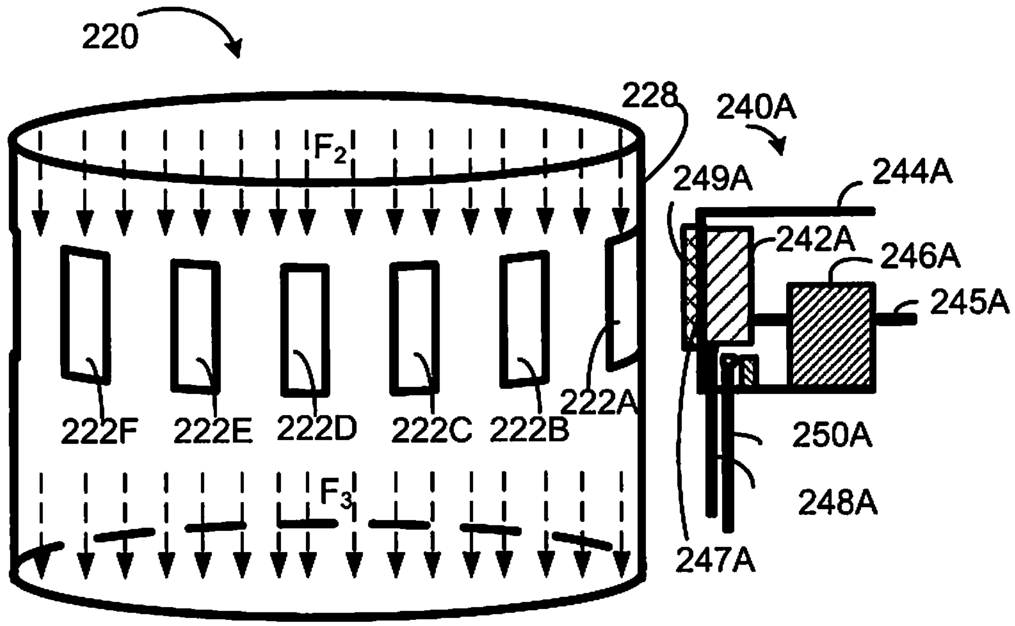
FIG. 3 illustrate exemplary power jet modules configured in the dispersion chamber of the processing system according to another embodiment of the invention in a perspective view.

FIG. 3 shows examples of power jet modules configured in the dispersion chamber of the processing system in a perspective view. In one embodiment, the power jet module 240A for jetting the liquid mixture into one or more streams of droplets and forcing the one or more streams into the processing system includes a power jet 242A for jetting a liquid mixture supplied to the power jet module 240A into one or more streams of droplets. The power jet module 240A further includes a support frame 244A for supporting the movement of the power jet 242A, a first module actuator 246A for moving the power jet to be correspondingly connected to an opening on the dispersion chamber, and a connector 245A connecting the first module actuator 246A and power jet 242A. The power jet module further includes a sealing element 249A, a door 247A, a second module actuator 248A, and a third module actuator 250A.

Also as shown in FIG. 3, the dispersion chamber 220 includes one or more openings 222A, 222B, 222C, 222D, 222E, and 222F positioned on the chamber wall of the dispersion chamber 220 and adapted to connecting to and fitting with the power jet of the power jet module on power jet's one face with nozzle array. The shapes of one or more openings and the arrangement of one or more openings in one embodiment are shown in FIG. 3, wherein the one or more openings are in rectangular shape with bottom width shorter than the side length, and positioned in an evenly distance adjacent to each other on a same horizontal line of the chamber wall.

Also as shown in FIG. 3, the dispersion chamber 220 is filled with multiple unified gases $F_2$ delivered from the buffer chamber of the processing chamber. In one embodiment, multiple unified gases $F_2$ can be delivered, concurrently with the formation of the streams of droplets inside dispersion chamber 220 jetted from the power jet of the power jet module, into the dispersion chamber 220 to carry the streams of droplets through the dispersion chamber 220, may or may not remove moisture from the mist, and form a gas-liquid mixture with a direction $F_3$ containing the liquid mixtures and multiple unified gases. Also, the flow of multiple unified gases $F_2$ can be delivered into the dispersion chamber 220 prior to the formation of the streams of droplets to fill and optionally preheat to a first temperature an internal volume of the dispersion chamber 220 prior to generating the streams of droplets inside the dispersion chamber 220.

In one embodiment, the one or more openings 222A-222F are positioned near the top of the dispersion chamber 220 that is positioned vertically (e.g., a dome-type dispersion chamber, etc.) to connect and fit the power jet modules for injecting the streams of droplets into the dispersion chamber 220 and passing through the dispersion chamber vertically downward. Alternatively, the one or more openings 222A-222F can be positioned near the bottom of the dispersion chamber 220 that is vertically positioned and be able to connect and fit the power jet modules for injecting the streams of droplets upward into the dispersion chamber by increasing the residence time of the streams generated therein. In another embodiment, when the dispersion chamber 220 is positioned horizontally (e.g., a tube dispersion chamber, etc.) and the one or more openings 222A-222F are positioned near one end of the dispersion chamber 220 such to fit and connect to the power jet modules that injecting the streams of droplets to be delivered from the one end through another end of the dispersion chamber 220, can pass through a path within the dispersion chamber 220 for the length of its residence time.

Additionally, in one embodiment, the streams of droplets jetted into the dispersion chamber 220 are dispersed with multiple uniform gas flows $F_2$ into a gas-liquid mixture $F_3$ containing the multiple uniform gas flows $F_2$ and the streams of droplets. In one embodiment, the dispersion chamber maintained itself at a first temperate.

In one embodiment of the invention, the direction of the multiple uniform gas flows $F_2$ delivered into the dispersion chamber is parallel to the chamber wall of the dispersion chamber 220. And the direction of the gas-liquid mixture $F_3$ delivered through the dispersion chamber 220 is also parallel to the chamber wall of the dispersion chamber 220. In another embodiment of the invention, the direction of the multiple uniform gas flows $F_2$ delivered into the dispersion chamber 220 and the direction of the gas-liquid mixture $F_3$ delivered through the dispersion chamber 220 are different.

Figure 4:
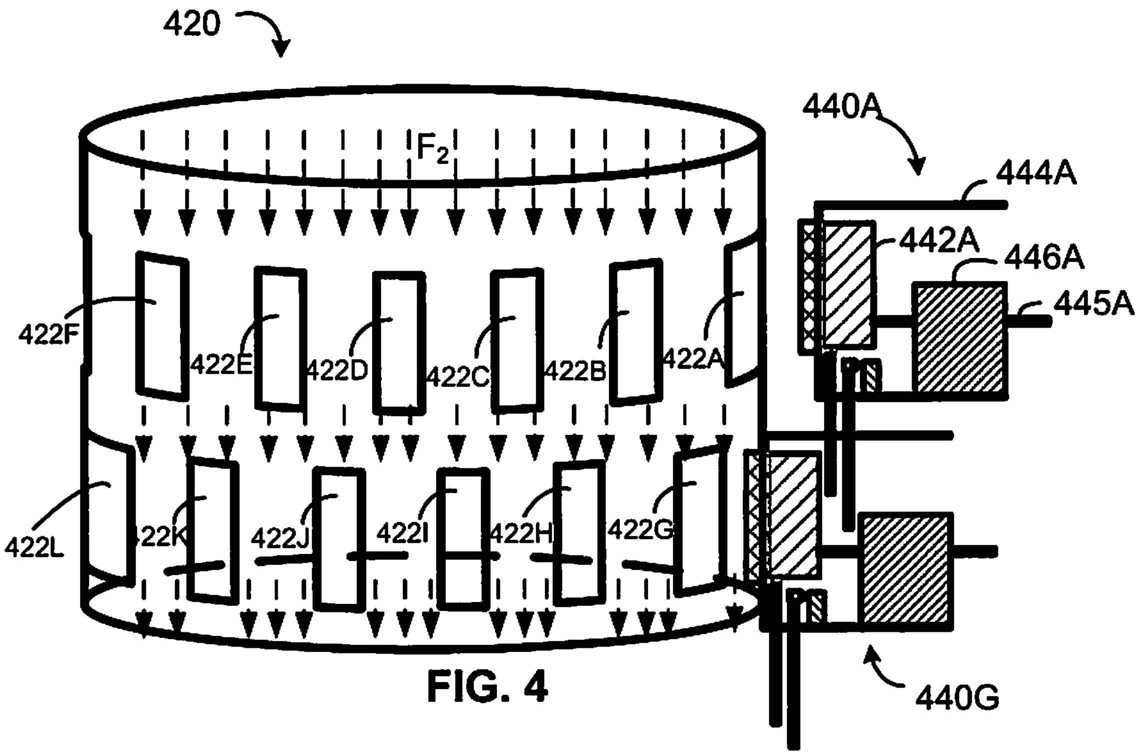
FIG. 4 illustrate exemplary power jet modules configured in the dispersion chamber of the processing system according to another embodiment of the invention in a perspective view.

FIG. 4 shows examples of one or more power jet modules configured in the dispersion chamber of the processing system in a perspective view. In one embodiment, the power jet module 440A for jetting the liquid mixture into one or more streams of droplets and forcing the one or more streams into the processing system includes a power jet 442A for jetting a liquid mixture supplied to the power jet module 440A into one or more streams of droplets. The power jet module 440A further includes a support frame 444A for supporting the movement of the power jet 442A, a first module actuator 446A for moving the power jet to be correspondingly connected to an opening on the dispersion chamber, and a connector 445A connecting the first module actuator 446A and power jet 442A. The power jet module further includes a sealing element 449A, a door 447A, a second module actuator 448A, and a third module actuator 450A. In the same embodiment, another power jet module 440G for jetting the liquid mixture into one or more streams of droplets and forcing the one or more streams into the processing system includes a power jet 442G for jetting a liquid mixture supplied to the power jet module 440G into one or more streams of droplets. The power jet module 440G further includes a support frame 444G for supporting the movement of the power jet 442G, a first module actuator 446G for moving the power jet to be correspondingly connected to an opening on the dispersion chamber, and a connector 445G connecting the first module actuator 446G and power jet 442G. The power jet module further includes a sealing element 449G, a door 447G, a second module actuator 448G, and a third module actuator 450G.

Also as shown in FIG. 4, the dispersion chamber 420 includes one or more openings 422A, 422B, 422C, 422D, 422E, 422F, 422G, 422H, 422I, 422J, 422K, and 422L positioned on the chamber wall of the dispersion chamber 420 and adapted to connecting to and fitting with the power jet of the power jet module on power jet's one face with nozzle array. The shapes of one or more openings in one embodiment are shown in FIG. 4, wherein the one or more openings are in rectangular shape with bottom width shorter than the side length. The arrangement of one or more openings in one embodiment is further shown in FIG. 4, wherein openings 422A-422F are positioned in an evenly distance adjacent to each other on a same horizontal line of the chamber wall in a first row and openings 422G-422L are positioned in an evenly distance adjacent to each other on a same horizontal line of the chamber wall in a second row different than the first row. Further, each of the openings 422A-422L is not positioned on a same vertical line of the chamber wall to avoid overlapping with each other.

Also as shown in FIG. 4, the dispersion chamber 420 is filled with multiple unified gases $F_2$ delivered from the buffer chamber of the processing chamber. In one embodiment, multiple unified gases $F_2$ can be delivered, concurrently with the formation of the streams of droplets inside dispersion chamber 420 jetted from the power jet of the power jet module, into the dispersion chamber 420 to carry the streams of droplets through the dispersion chamber 420, may or may not remove moisture from the mist, and form a gas-liquid mixture with a direction $F_3$ containing the liquid mixtures and multiple unified gases. Also, the flow of multiple unified gases $F_2$ can be delivered into the dispersion chamber 420 prior to the formation of the streams of droplets to fill and optionally preheat to a first temperature an internal volume of the dispersion chamber 420 prior to generating the streams of droplets inside the dispersion chamber 420.

In one embodiment, the one or more openings 422A-422F are positioned near the top of the dispersion chamber 420 that is positioned vertically (e.g., a dome-type dispersion chamber, etc.) to connect and fit the power jet modules for injecting the streams of droplets into the dispersion chamber 420 and passing through the dispersion chamber vertically downward. Further, in the same embodiment, the one or more openings 422G-422L are positioned near the bottom of the dispersion chamber 420. In another embodiment, when the dispersion chamber 420 is positioned horizontally (e.g., a tube dispersion chamber, etc.) and the one or more openings 422A-422F are positioned near one end of the dispersion chamber 420 such to fit and connect to the power jet modules that injecting the streams of droplets to be delivered from the one end through another end of the dispersion chamber 420, can pass through a path within the dispersion chamber 420 for the length of its residence time. Further, in the same embodiment, the one or more openings 422G-422L are positioned near the other end of the dispersion chamber 420.

Additionally, in one embodiment, the streams of droplets jetted into the dispersion chamber 420 are dispersed with multiple uniform gas flows $F_2$ into a gas-liquid mixture $F_3$ containing the multiple uniform gas flows $F_2$ and the streams of droplets. In one embodiment, the dispersion chamber maintained itself at a first temperate.

In one embodiment of the invention, the direction of the multiple uniform gas flows $F_2$ delivered into the dispersion chamber is parallel to the chamber wall of the dispersion chamber 420. And the direction of the gas-liquid mixture $F_3$ delivered through the dispersion chamber 420 is also parallel to the chamber wall of the dispersion chamber 420. In another embodiment of the invention, the direction of the multiple uniform gas flows $F_2$ delivered into the dispersion chamber 420 and the direction of the gas-liquid mixture $F_3$ delivered through the dispersion chamber 420 are different.

Figure 5:
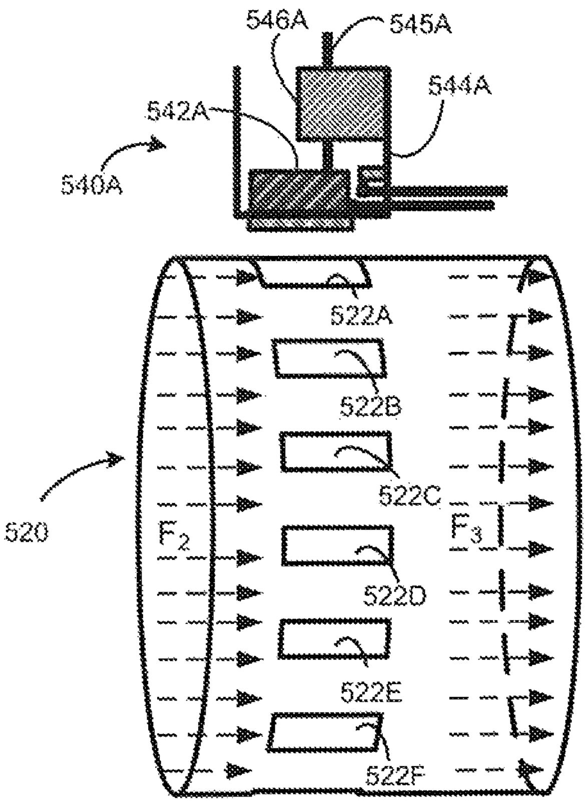
FIG. 5 illustrate exemplary power jet modules configured in the dispersion chamber of the processing system according to another embodiment of the invention in a perspective view.

FIG. 5 shows examples of power jet modules configured in the dispersion chamber of the processing system in a perspective view. In one embodiment, the power jet module 540A for jetting the liquid mixture into one or more streams of droplets and forcing the one or more streams into the processing system includes a power jet 542A for jetting a liquid mixture supplied to the power jet module 540A into one or more streams of droplets. The power jet module 540A further includes a support frame 544A for supporting the movement of the power jet 542A, a first module actuator 546A for moving the power jet to be correspondingly connected to an opening on the dispersion chamber, and a connector 545A connecting the first module actuator 546A and power jet 542A. The power jet module further includes a sealing element, a door, a second module actuator, and a third module actuator.

Also as shown in FIG. 5, the dispersion chamber 520 includes one or more openings 522A, 522B, 522C, 522D, 522E, and 522F positioned on the chamber wall of the dispersion chamber 520 and adapted to connecting to and fitting with the power jet of the of the power jet module on power jet's one face with nozzle array and with a bottom width longer than the side length thereof. In one embodiment, the shapes of one or more openings and the arrangement of one or more openings are shown in FIG. 5, wherein the one or more openings are in rectangular shape with bottom width longer than the side length, and positioned in an evenly distance adjacent to each other on a same vertical line of the chamber wall.

In one embodiment, the one or more openings 522A-522F are positioned near the left end of the dispersion chamber 520 that is positioned horizontally (e.g., a tube dispersion chamber, etc.) to connect and fit the power jet modules for injecting the streams of droplets into the dispersion chamber 520 and passing through the dispersion chamber from one end to the other. Alternatively, the one or more openings 522A-522F can be positioned near the right end of the dispersion chamber 520 that is horizontally positioned and be able to connect and fit the power jet modules for injecting the streams of droplets upward into the dispersion chamber for the length of its residence time of the streams generated therein. In one embodiment, the dispersion chamber maintained itself at a first temperate.

In one embodiment of the invention, the direction of the multiple uniform gas flows $F_2$ delivered into the dispersion chamber is parallel to the chamber wall of the dispersion chamber 520. And the direction of the gas-liquid mixture $F_3$ delivered through the dispersion chamber 520 is also parallel to the chamber wall of the dispersion chamber 520. In another embodiment of the invention, the direction of the multiple uniform gas flows $F_2$ delivered into the dispersion chamber 520 and the direction of the gas-liquid mixture $F_3$ delivered through the dispersion chamber 520 are different.

In one embodiment of the invention, the direction of the multiple uniform gas flows $F_2$ delivered into the dispersion chamber is parallel to the chamber wall of the dispersion chamber 520. And the direction of the gas-liquid mixture $F_3$ formed by dispersing multiple uniform gas flows $F_2$ into streams of droplets from the power jets delivered through the dispersion chamber 520 is parallel to the chamber wall of the dispersion chamber 520.

Figure 6:
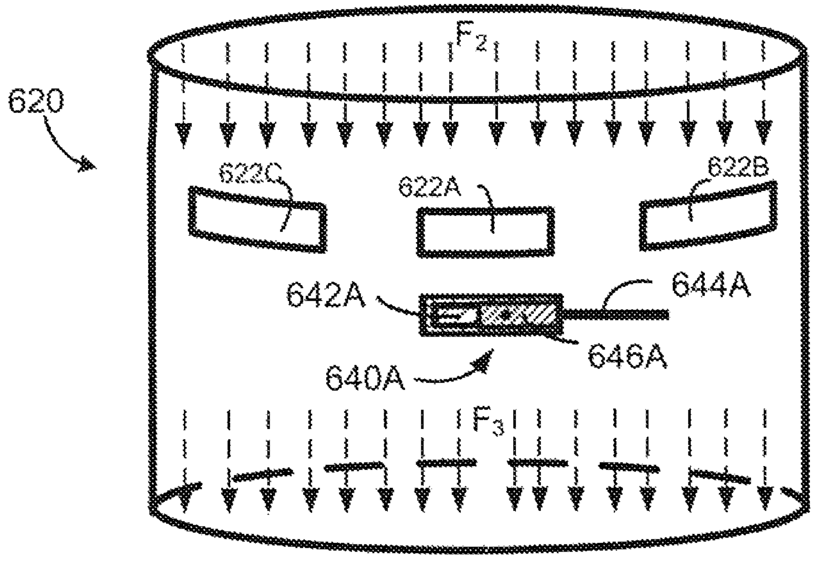
FIG. 6 illustrate exemplary power jet modules configured in the dispersion chamber of the processing system according to another embodiment of the invention in a perspective view.

FIG. 6 shows examples of power jet modules configured in the dispersion chamber of the processing system in a perspective view. In one embodiment, the power jet module 640A for jetting the liquid mixture into one or more streams of droplets and forcing the one or more streams into the processing system includes a power jet 642A for jetting a liquid mixture supplied to the power jet module 640A into one or more streams of droplets. The power jet module 640A further includes a support frame 644A for supporting the movement of the power jet 642A, a first module actuator 646A for moving the power jet to be correspondingly connected to an opening on the dispersion chamber, and a connector connecting the first module actuator 646A and power jet 642A. The power jet module further includes a sealing element, a door, a second module actuator, and a third module actuator.

Also as shown in FIG. 6, the dispersion chamber 620 includes one or more openings 622A, 622B, 622C positioned on the chamber wall of the dispersion chamber 620 and adapted to connecting to and fitting with the power jet of the power jet module on power jet's one face with nozzle array. In one embodiment, the shapes of one or more openings and the arrangement of one or more openings are shown in FIG. 6, wherein the one or more openings are in rectangular shape with bottom width longer than the side length, and positioned in an evenly distance adjacent to each other on a same horizontal line of the chamber wall.

Also as shown in FIG. 6, the dispersion chamber 620 is filled with multiple unified gases $F_2$ delivered from the buffer chamber of the processing chamber. In one embodiment, multiple unified gases $F_2$ can be delivered, concurrently with the formation of the streams of droplets inside dispersion chamber 620 jetted from the power jet of the power jet module, into the dispersion chamber 620 to carry the streams of droplets through the dispersion chamber 620, may or may not remove moisture from the mist, and form a gas-liquid mixture with a direction $F_3$ containing the liquid mixtures and multiple unified gases. Also, the flow of multiple unified gases $F_2$ can be delivered into the dispersion chamber 620 prior to the formation of the streams of droplets to fill and optionally preheat to a first temperature an internal volume of the dispersion chamber 620 prior to generating the streams of droplets inside the dispersion chamber 620.

In one embodiment, the one or more openings 622A-622C are positioned near the top of the dispersion chamber 620 that is positioned vertically (e.g., a dome-type dispersion chamber, etc.) to connect and fit the power jet modules for injecting the streams of droplets into the dispersion chamber 620 and passing through the dispersion chamber vertically downward. Alternatively, the one or more openings 622A-622C can be positioned near the bottom of the dispersion chamber 620 that is vertically positioned and be able to connect and fit the power jet modules for injecting the streams of droplets upward into the dispersion chamber by increasing the residence time of the streams generated therein. In another embodiment, when the dispersion chamber 620 is positioned horizontally (e.g., a tube dispersion chamber, etc.) and the one or more openings 622A-622C are positioned near one end of the dispersion chamber 620 such to fit and connect to the power jet modules that injecting the streams of droplets to be delivered from the one end through another end of the dispersion chamber 620, can pass through a path within the dispersion chamber 620 for the length of its residence time. In one embodiment, the dispersion chamber maintained itself at a first temperate.

In one embodiment of the invention, the direction of the multiple uniform gas flows $F_2$ delivered into the dispersion chamber is parallel to the chamber wall of the dispersion chamber 620. And the direction of the gas-liquid mixture $F_3$ formed by dispersing multiple uniform gas flows F2 into streams of droplets from the power jets delivered through the dispersion chamber 620 is parallel to the chamber wall of the dispersion chamber 620.

Figure 7A:
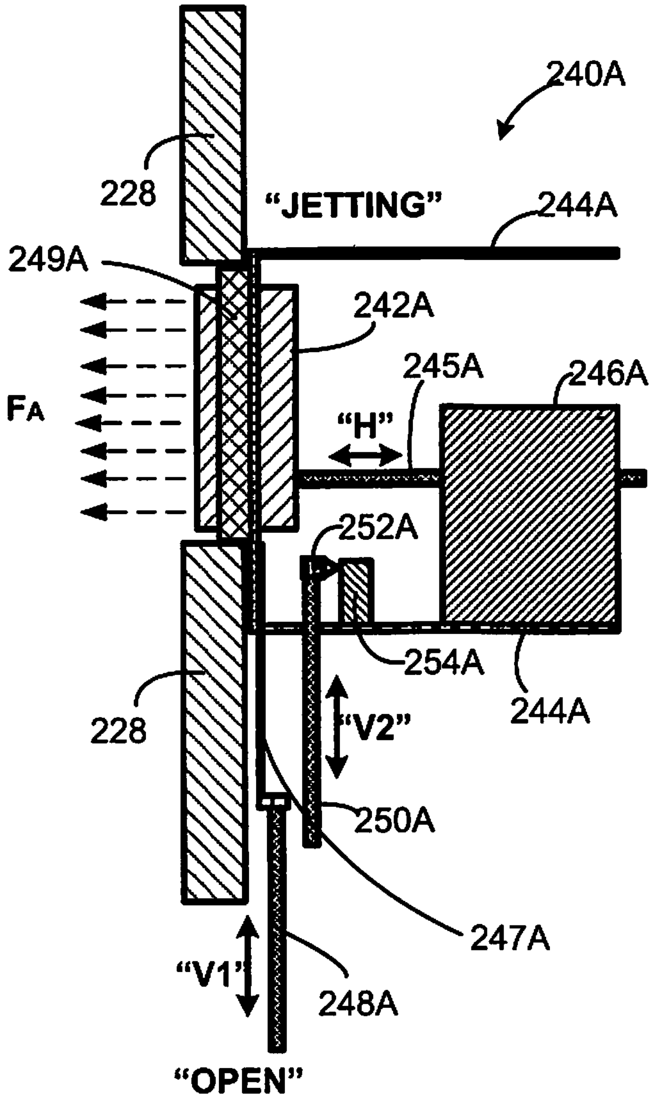
FIG. 7A is a sectional view of the exemplary power jet module coupled to a dispersion chamber when the door of the power jet module is in a "open" position and liquid mixture is being jetted into the dispersion chamber.

FIG. 7A is a front view of the exemplary power jet module adapted to be coupled to a dispersion chamber being sealed with the opening on the chamber wall 228 of the dispersion chamber by a sealing element 249A of the power jet module 240A and the power jet of the power jet module positioned at a first position where the power jet 242A is positioned to be connected to the opening of the dispersion chamber. In one embodiment, the power jet 242A is able to jet one or more streams of droplets $F_A$ into the dispersion chamber at the first position under the control of electronic control center.

Referring back to FIG. 3, the power jet module further includes a support frame 244A, a first module actuator 246A for supporting the movement of the power jet 242A, a door 247A, a second module actuator 248A adapted to move the door 247A, and a third module actuator 250A. In one embodiment, the power jet module 240A further includes a cleaning assembly, which includes a movable cleaning blade element 252A to be moved by the third module actuator 250A and a movable suction element 254A.

In one embodiment, the first module actuator 246A is controlled by an electronic control center and adapted to move the power jet by moving a connector 245A connected the first module actuator 246A and the power jet 242A along the direction of "H," vertical to the chamber wall of the dispersion chamber. Being moved by the first module actuator 246A towards the opening on the dispersion chamber along the direction of "H," the connector 245A simultaneously move the power jet 242A towards the opening on the dispersion chamber along the direction of "H." Similarly, being moved by the first module actuator 246A away from the opening on the dispersion chamber along the direction of "H," the connector 245A simultaneously move the power jet 242A away from the opening on the dispersion chamber along the direction of "H." The first position of the power jet 242A is achieved when the power jet 242A is moved to be correspondingly connected to an opening on the dispersion chamber.

In one embodiment, the second module actuator 248A is adapted to move the door 247A along the director of V1, parallel to the chamber wall of the dispersion chamber. The first position of the power jet 242A is achieved when the door 247A is moved to be at an open position where the power jet 242A passes through the door 247A to be connected to an opening on the dispersion chamber.

Figure 7B:
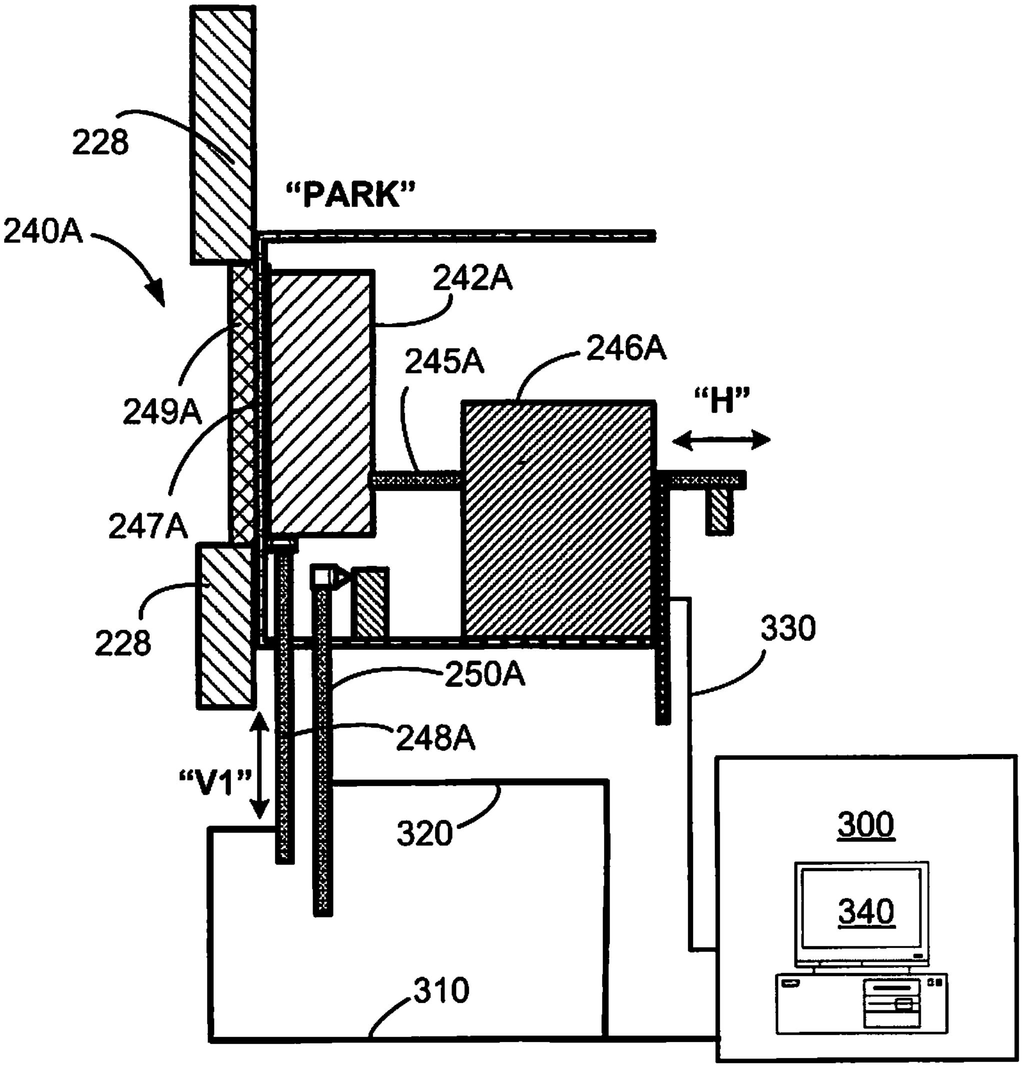
FIG. 7B is a sectional view of the exemplary power jet module coupled to a dispersion chamber when the power jet module is in a "park" position and the door of the power jet module is closed.

FIG. 7B is a front view of the exemplary power jet module adapted to be coupled to a dispersion chamber being sealed with the opening on the chamber wall 228 of the dispersion chamber by a sealing element 249A of the power jet module 240A and power jet of the power jet module positioned at a second position where the power jet 242A of the power jet module 240A is positioned to be away from the opening of the dispersion chamber. In one embodiment, the power jet 242A is not jetting one or more streams of droplets $F_A$ into the dispersion chamber at the second position under the control of electronic control center.

Referring back to FIG. 3, the power jet module further includes a support frame 244A, a first module actuator 246A for supporting the movement of the power jet 242A, a door 247A, a second module actuator 248A adapted to move the door 247A, and a third module actuator 250A. In one embodiment, the power jet module 240A further includes a cleaning assembly, which includes a movable cleaning blade element 252A to be moved by the third module actuator 250A and a movable suction element 254A. In one embodiment, the electronic control center includes connection wire 310 connecting and controlling the movement of the second module actuator 248A along the director of "V1", connection wire 320 connecting and controlling the movement of the third module actuator 250A along the director of "V2", connection wire 330 connecting and controlling the movement of the first module actuator 248A along the director of "H" and CPU 340.

In one embodiment, the first module actuator 246A is controlled by an electronic control center and adapted to move the power jet by moving a connector 245A connected the first module actuator 246A and the power jet 242A along the direction of "H", vertical to the chamber wall of the dispersion chamber referring back to FIG. 7A. The second position of the power jet 242A is achieved when the power jet 242A is moved to be away from the opening on the dispersion chamber.

In one embodiment, the second module actuator 248A is adapted to move the door 247A along the director of "V1", parallel to the chamber wall of the dispersion chamber referring back to FIG. 7A. The second position of the power jet 242A is achieved when the door 247A is moved to be at a closed position where the power jet 242A is shield from passing through the door 247A.

Figure 7C:
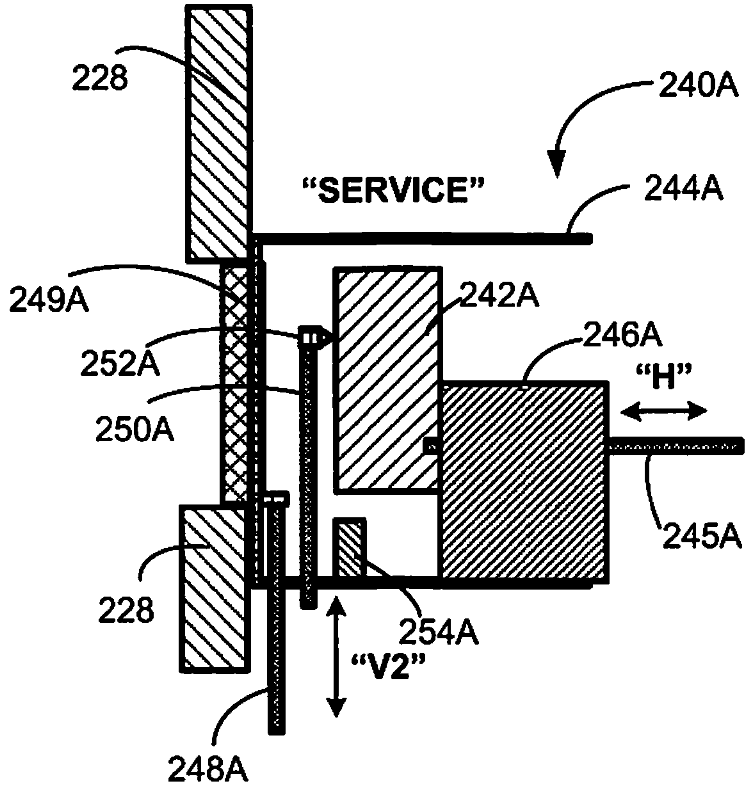
FIG. 7C is a sectional view of the exemplary power jet module coupled to a dispersion chamber when the power jet module is in a "service" position and the door of the power jet module is closed.

FIG. 7C is a front view of the exemplary power jet module adapted to be coupled to a dispersion chamber being sealed with the opening on the chamber wall 228 of the dispersion chamber by a sealing element 249A of the power jet module 240A and the cleaning assembly of the power jet module 240A for cleaning the power jet of the power jet module. As shown in FIG. 7C, the power jet module 240A further includes a cleaning assembly, which includes a movable cleaning blade element 252A to be moved by a third module actuator 250A along the director of "V2" and a movable suction element 254A.

In one embodiment, the third module actuator 250A is adapted to move the cleaning blade element 252A along the direction of V2, parallel to the face with an array of one or more nozzle orifices of the power jet 242A and clean the face with the cleaning blade element 252A when the power jet 252A is at a second position where the power jet 252A is positioned away from the opening on the chamber wall of the dispersion chamber and attaching the cleaning blade element 252A on its face with the array of one or more nozzle orifices. In one embodiment, the power jet 242A is moved at the second position, referring back to FIG. 7B, and the door 247A is moved at the closed position.

Figure 8:
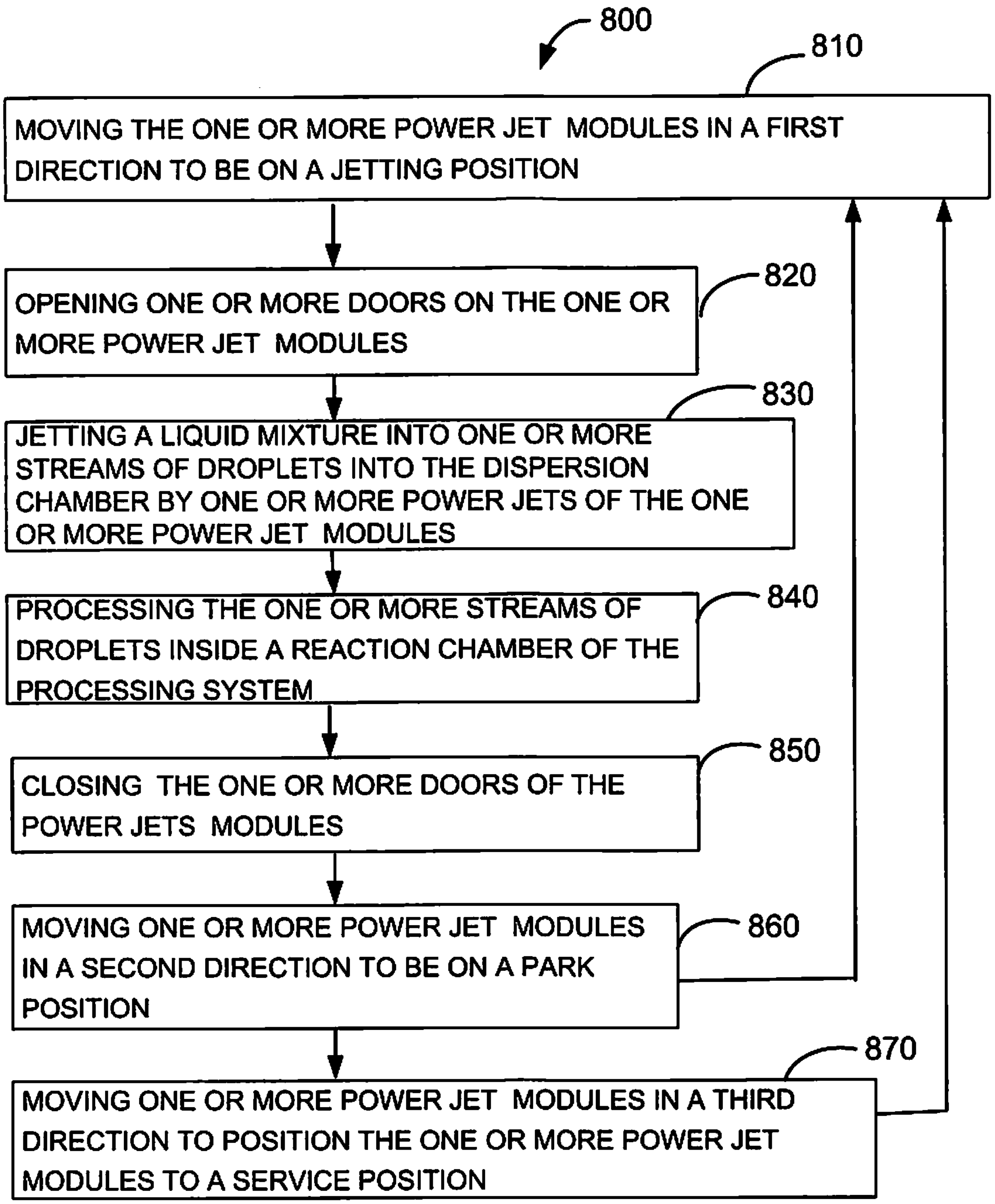
FIG. 8 shows the steps of a method to perform on a system with power jet modules coupled to a dispersion chamber.

Method to Perform on a System with Power Let Modules Coupled to a Dispersion Chamber for Producing a Product Material from a Liquid Mixture FIG. 8 shows the steps of a method 800 to perform on a system with power jet modules coupled to a dispersion chamber. Method 800 includes a step 810, a step 820, a step 830, a step 840, a step 850, a step 860, and a step 870.

Step 810 of the method 800 includes moving one or more power jet modules in a first direction to be one a jetting position. Step 820 of the method 800 includes opening one or more doors on the one or more power jet modules. Step 830 of the method 800 includes jetting a liquid mixture into one or more streams of droplets into the dispersion chamber by one or more power jets of the one or more power jet modules.

In one embodiment, the liquid mixture is formed from two or more precursors. In general, liquid form of a precursor compound can be prepared directly into a liquid mixture in a desired concentration. Solid form of a precursor compound can be dissolved or dispersed in a suitable solvent (e.g., water, alcohol, isopropanol, or any other organic or inorganic solvents, and their combinations) to form into a liquid mixture of an aqueous solution, slurry, gel, aerosol or any other suitable liquid forms. For example, desirable molar ratio of two or more solid precursors can be prepared into a liquid mixture, such as by measuring and preparing appropriate amounts of the two or more solid precursors into a container with suitable amounts of a solvent. Depending on the solubility of the precursors in the solvent, pH, temperature, and mechanical stirring and mixing can be adjusted to obtain a liquid mixture where the precursor compounds are fully dissolved and/or evenly dispersed.

In one example, two or more metal-containing precursors are mixed into a liquid mixture for obtaining a final reaction product of a mixed metal oxide material. Exemplary metal-containing precursors include, but are not limited to, metal salts, lithium-containing compound, cobalt-containing compound, manganese-containing compound, nickel-containing compound, lithium sulfate ($Li_2SO_4$), lithium nitrate ($LiNO_3$), lithium carbonate ($Li_2CO_3$), lithium acetate ($LiCH_2COO$), lithium hydroxide (LiOH), lithium formate ($LiCHO_2$), lithium chloride (LiCl), cobalt sulfate ($CoSO_4$), cobalt nitrate ($Co(NO_3)_2$), cobalt carbonate ($CoCO_3$), cobalt acetate ($Co(CH_2COO)_2$), cobalt hydroxide ($Co(OH)_2$), cobalt formate ($Co(CHO_2)_2$), cobalt chloride ($CoCl_2$), manganese sulfate ($MnSO_4$), manganese nitrate ($Mn(NO_3)_2$), manganese carbonate ($MnCO_3$), manganese acetate ($Mn(CH_2COO)_2$), manganese hydroxide ($Mn(OH)_2$), manganese formate ($Mn(CHO_2)_2$), manganese chloride ($MnCl_2$), nickel sulfate ($NiSO_4$), nickel nitrate ($Ni(NO_3)_2$), nickel carbonate ($NiCO_3$), nickel acetate ($Ni(CH_2COO)_2$), nickel hydroxide ($Ni(OH)_2$), nickel formate ($Ni(CHO_2)_2$), nickel chloride ($NiCl_2$), aluminum (AD-containing compound, titanium (Ti)-containing compound, sodium (Na)-containing compound, potassium (K)-containing compound, rubidium (Rb)-containing compound, vanadium (V)-containing compound, cesium (Cs)-containing compound, chromium (Cr)-containing compound, copper (Cu)-containing compound, magnesium (Mg)-containing compound, iron (Fe)-containing compound, and combinations thereof, among others.

Not wishing to be bound by theory, it is contemplated that, in order to prepare an oxide material with two or more different metals, all of the required metal elements are first mixed into a liquid mixture (e.g., into a solution, a slurry, or a gel mixture) using two or more metal-containing precursor compounds as the sources of each metal element such that the two or more different metals can be mixed uniformly at desired ratio. As an example, to prepare a liquid mixture of an aqueous solution, slurry, or gel, one or more metal salts with high water solubility can be used. For example, metal nitrate, metal sulfate, metal chloride, metal acetate, metal formate can be used. Organic solvents, such as alcohols, isopropanol, etc., can be used to dissolve or disperse metal-containing precursors with low water solubility. In some cases, the pH value of the liquid mixture can be adjusted to increase the solubility of the one or more precursor compounds. Optionally, chemical additives, gelation agents, and surfactants, such as ammonia, EDTA, etc., can be added into the liquid mixture to help dissolve or disperse the precursor compounds in a chosen solvent.

In one embodiment, the power jet modules are selected from a group of a nozzle, a sprayer, an atomizer, or any other mist generators. The power jet modules employ air pressure to jet the liquid mixture and convert it into liquid droplets. As an example, an atomizer can be attached to a portion of the dispersion chamber to spray or inject the liquid mixture into a mist containing small sized droplets directly inside the dispersion chamber. In general, a mist generator that generates a mist of mono-sized droplets is desirable. Alternatively, a mist can be generated outside the dispersion chamber and delivered into the dispersion chamber.

Desired liquid droplet sizes can be adjusted by adjusting the sizes of liquid delivery/injection channels within the mist generator. Droplet size ranging from a few nanometers to a few hundreds of micrometers can be generated. Suitable droplet sizes can be adjusted according to the choice of the mist generator used, the liquid mixture compounds, the temperature of the dispersion chamber, the flow rate of the first gas, and the residence time inside the dispersion chamber. As an example, a mist with liquid droplet sizes between one tenth of a micron and one millimeter is generated inside the dispersion chamber.

Not wishing to be bound by theory, in the method 800 of producing a particulate material, it is contemplated that the two or more precursor compounds are prepared into a liquid mixture and then converted into droplets, each droplet will have the two or more precursors uniformly distributed together. Then, the moisture of the liquid mixture is removed by passing the droplets through the dispersion chamber and the flow of the first gas is used to carry the mist within the dispersion chamber for a suitable residence time. It is further contemplated that the concentrations of the precursor compounds in a liquid mixture and the droplet sizes of the mist of the liquid mixture can be adjusted to control the chemical composition, particle sizes, and size distribution of final product particles of the battery material.

In one embodiment, the one or more streams of droplets is dispersed into the dispersion chamber at a first temperature and for a desired first residence time to remove its moisture. As the dispersion of the moisture from the one or more streams of droplets of the precursor compounds is performed within the dispersion chamber filled with a gas flow, a gas-liquid mixture composing of the heated first gas and the liquid mixture is formed. Accordingly, one embodiment of the invention provides that the gas flow flowed within the dispersion chamber is used as the gas source for forming a gas-liquid mixture within the dispersion chamber. In another embodiment, the gas flown within the dispersion chamber is heated and the thermal energy of the heated gas flows served as the energy source for carrying out drying reaction and other reactions inside the dispersion chamber. The gas flow can be heated to a temperature of between 70° C. to 600° C. by passing through a suitable heating mechanism, such as electricity powered heater, fuel-burning heater, etc.

In one configuration, the gas flow is pre-heated prior to flowing into the dispersion chamber. Optionally, drying the one or more streams of droplets can be carried out by heating the dispersion chamber directly, such as heating the chamber body of the dispersion chamber. The advantages of using heated gas are fast heat transfer, high temperature uniformity, and easy to scale up, among others. The dispersion chambers may be any chambers, furnaces with enclosed chamber body, such as a dome type ceramic dispersion chamber, a quartz chamber, a tube chamber, etc. Optionally, the chamber body is made of thermal insulation materials (e.g., ceramics, etc.) to prevent heat loss during drying.

The gas flow may be, for example, air, oxygen, carbon dioxide, nitrogen gas, hydrogen gas, inert gas, noble gas, and combinations thereof, among others. For example, heated air can be used as an inexpensive gas source and energy source for drying the mist. The choice of the gas flow may be a gas that mix well with the mist of the liquid mixtures and dry the mist without reacting to the liquid mixtures. In some cases, the chemicals in the droplets/mist may react to the gas flow and/or to each other to certain extent during drying within the dispersion chamber, depending on the first temperature and the chemical composition of the liquid mixtures. In addition, the residence time of the mist of thoroughly mixed liquid mixture compounds within the dispersion chamber is adjustable and may be, for example, between one second and one hour, depending on the flow rate of the gas flow, and the length of the path that the mist has to flow through within the dispersion chamber.

Step 840 of the method 800 includes processing the one or more streams of droplets inside a reaction chamber of the processing system. The reaction chamber can be a fluidized bed reactor, such as a circulating fluidized bed reactor, a bubbling fluidized bed reactor, an annular fluidized bed reactor, a flash fluidized bed reactor, and combinations thereof. In addition, the reaction chamber can be any of a furnace-type reactor, such as a rotary furnace, a stirring furnace, a furnace with multiple temperature zones, and combinations thereof.

In one embodiment, the one or more streams of droplets is reacted for a second residence time into a reaction product and at a second temperature inside the reaction chamber. The second residence time may be any residence time to carry out a complete reaction of the streams of droplets, such as a residence time of between one second and ten hours, or longer. Reactions of the streams of droplets within the reaction chamber may include any of oxidation, reduction, decomposition, combination reaction, phase-transformation, re-crystallization, single displacement reaction, double displacement reaction, combustion, isomerization, and combinations thereof. For example, the streams of droplets may be oxidized, such as oxidizing the liquid mixture compounds into an oxide material.

In one embodiment, it is contemplated to obtain a type of solid particles from a reaction of the streams of droplets within the reaction chamber using energy from a second gas flow that is heated to a reaction temperature to fully complete the reaction and obtain desired crystal structure of final reaction products. The advantages of flowing air or gas already heated are faster heat transfer, uniform temperature distribution (especially at high temperature range), and easy to scale up, among others. Exemplary second gas flow include, but are not limited to air, oxygen, carbon dioxide, an oxidizing gas, nitrogen gas, inert gas, noble gas, and combinations thereof. For an oxidation reaction inside the reaction chamber, an oxidizing gas can be used as the second gas flow. For reduction reactions inside the reaction chamber, a reducing gas can be used as the second gas flow.

In one embodiment, a reaction products (e.g., a gas-solid mixture of oxidized reaction products mixed with second gas and/or other gas-phase by-products, or waste products, etc.) are delivered out of the reaction chamber and cooled to obtain final solid particles of desired size, morphology, and crystal structure, ready to be further used for battery applications. For example, the reaction product may be slowly cooled down to room temperature to avoid interfering or destroying a process of forming into its stable energy state with uniform morphology and desired crystal structure.

Step 850 of the method 800 includes closing the one or more doors of the power jets modules. Step 860 of the method 800 includes moving the one or more power jet modules in a second direction to be on a park position. Optionally, Step 810 of the method 800 will be performed after Step 860. Step 870 of the method 800 includes moving one or more power jet modules in a third direction to position the one or more power jet modules to a service position. Optionally, Step 810 of the method 800 will be performed after Step 870.

Figure 9:
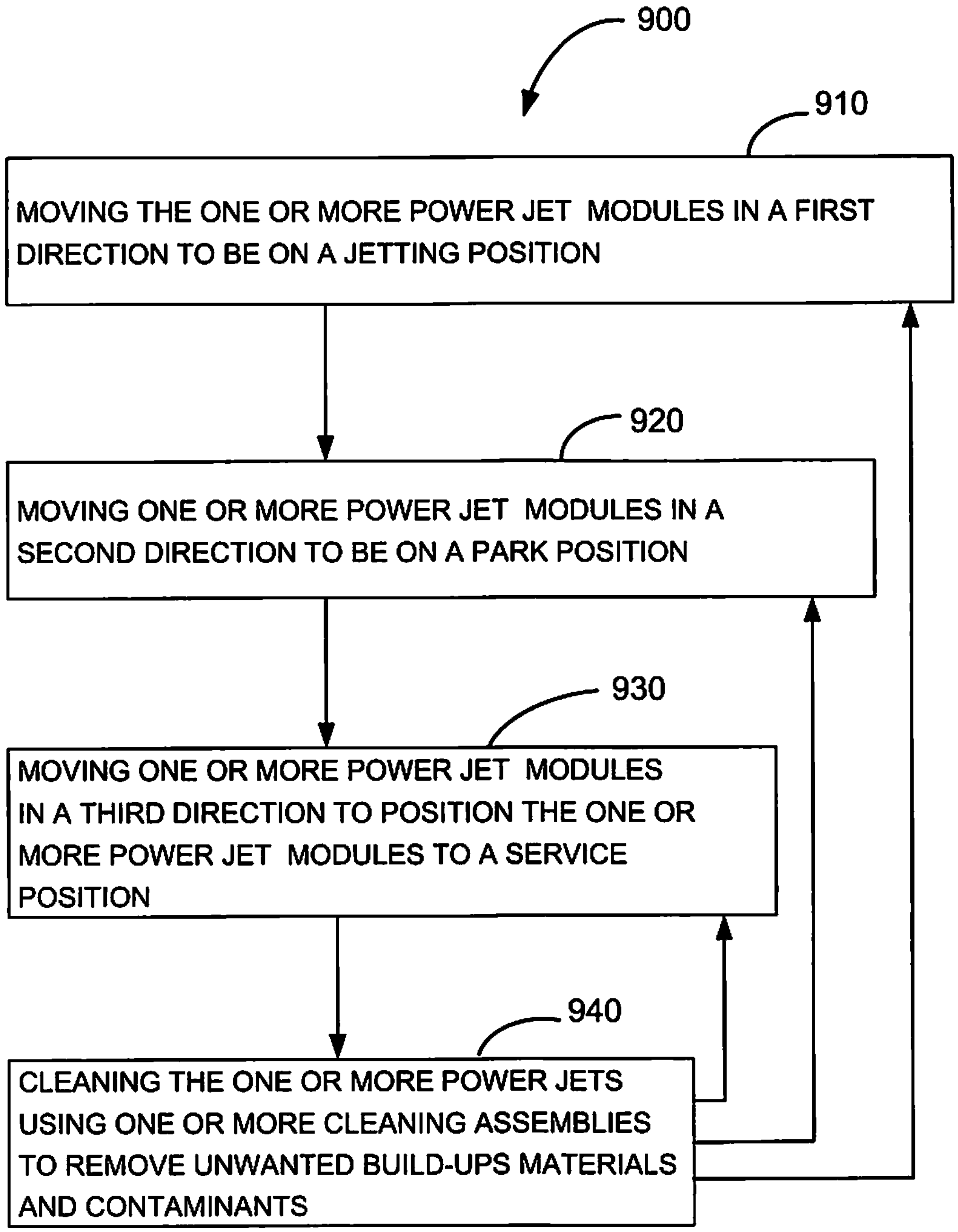
FIG. 9 shows the steps of a method to perform on a system with power jet modules coupled to a dispersion chamber for producing a product material from a liquid mixture.

FIG. 9 shows the steps of a method 900 to perform on a system with power jet modules. Method 900 includes a step 910, a step 920, a step 930, and a step 940.

Step 910 of the method 900 includes moving one or more power jet modules in a first direction to be on a jetting position. Step 920 of the method 900 includes moving one or more power jet modules in a second direction to be on a park position. Step 930 of the method 900 includes moving one or more power jet modules in a third direction to position the one or more power jet modules to a service position. Step 940 of the method 900 includes cleaning the one or more power jets using one or more cleaning assemblies to remove unwanted build-ups materials and contaminants. Optionally, either step 910, 920, or 930 can be performed after step 940 of the method 900.

While the foregoing is directed to embodiments of the present invention, other and further embodiments of the invention may be devised without departing from the basic scope thereof, and the scope thereof is determined by the claims that follow.

What is claimed is:

1. A processing system for producing a product material from a liquid mixture, comprising:

an array of one or more power jet modules comprising one or more power jets adapted to jet the liquid mixture into one or more streams of droplets and force the one or more streams of droplets into the processing system, wherein each power jet module comprises a power jet, and wherein each power jet comprises an array of one or more nozzle orifices, each orifice is adapted to jet the liquid mixture into one or more streams of droplets;

a dispersion chamber comprising a chamber wall with one or more openings adapted to be coupled to the one or more power jet modules and receive the one or more streams of droplets being dispersed with one or more gas flows therein within the dispersion chamber, wherein each power jet module is adapted to be positioned at a first position to be connected to a corresponding opening on the chamber wall of the dispersion chamber, and at a second position to be away from the corresponding opening on the chamber wall of the dispersion chamber; and a reaction chamber connected to the dispersion chamber and adapted to process the one or more streams of droplets into the product material.

2. The processing system of claim 1, wherein the power jet of each power jet module is adapted to be movably coupled to the corresponding opening on the chamber wall of the dispersion chamber.

3. The processing system of claim 2, wherein each power jet modules further comprises a support frame and a first actuator for supporting the movement of the power jet.

4. The processing system of claim 3, wherein the first actuator is controlled by an electronic control center and is adapted to move the power jet to be correspondingly connected to an opening on the dispersion chamber.

5. The processing system of claim 3, wherein the power jet of each power jet module is moved by the first actuator of the power jet module to be positioned at a first position being connected to the opening of the dispersion chamber.

6. The processing system of claim 3, wherein each power jet module further comprises a sealing element to seal each power jet module with the opening of the dispersion chamber at the first position.

7. The processing system of claim 3, wherein the power jet of each power jet module is moved by the first actuator of the power jet module to be positioned at a second position being away from the opening of the dispersion chamber.

8. The processing system of claim 6, wherein the power jet of each power jet module further comprises a door such that the power jet is adapted to be positioned in a closed position and in an open position via a second actuator.

9. The processing system of claim 1, wherein each power jet module further comprises a cleaning assembly.

10. The processing system of claim 9, wherein the cleaning assembly of each power jet module further comprises a movable cleaning blade element.

11. The processing system of claim 9, wherein the cleaning assembly of each power jet module further comprises a movable suction element.

12. The processing system of claim 1, further comprising a buffer chamber having a gas distributor with one or more channels therein for forming one or more carrier gases into one or more gas flows.

13. The processing system of claim 1, wherein the processing system further comprises an electronic control center.

14. A processing system for producing a product material from a liquid mixture, comprising:

an array of one or more power jet modules adapted to jet the liquid mixture into one or more streams of droplets, wherein each power jet module comprises a power jet and a support frame for supporting the movement of the power jet;

a dispersion chamber adapted to be connected to the one or more power jet modules and receive the one or more streams of droplets therein, wherein the power jet of each power jet module is adapted to be positioned at a first position to be connected to an opening of the dispersion chamber and at a second position to be away from the opening of the dispersion chamber; and a reaction chamber connected to the dispersion chamber and adapted to process the one or more streams of droplets into the product material.

15. The processing system of claim 14, wherein each power jet module further comprises a sealing element to fix each power jet module on the opening of the dispersion chamber at the first position.

16. The processing system of claim 14, wherein the power jet comprises an array of one or more nozzle orifices and each orifice is adapted to jet the liquid mixture into one or more streams of droplets.

17. A method to producing a product material from a liquid mixture on a processing system with one or more power jet modules, the one or more power jet modules comprising one or more doors, comprising:

moving each of the one or more power jet modules in a first direction to be positioned at a first position and be connected to an opening of a dispersion chamber of a processing system;

matching each of the one or more power jets modules to each of one or more openings on the dispersion chamber;

opening one or more doors of the one or more power jet modules;

processing the one or more streams of droplets inside a reaction chamber of the processing system;

closing the one or more doors of the power jets modules;

moving each of the one or more power jet modules in a second direction to be positioned at a second position and be away from the opening of the dispersion chamber.

18. The method of claim 17, further comprising cleaning the one or more power jets using one or more cleaning assemblies to remove unwanted build-ups materials and contaminants.

19. The method of claim 17, further comprising drying the one or more streams of droplets at a first temperature.

20. The method of claim 17, further comprising reacting the one or more streams of droplets at a second temperature into the product material.

* * * * *